United States Patent
Yiannoulos

[19]

[11] Patent Number: 5,939,742
[45] Date of Patent: Aug. 17, 1999

[54] FIELD-EFFECT PHOTO-TRANSISTOR

[75] Inventor: Aristides A. Yiannoulos, Wyomissing Hills, Pa.

[73] Assignee: Lucent Technologies Inc., Murray Hill, N.J.

[21] Appl. No.: 08/798,327

[22] Filed: Feb. 10, 1997

[51] Int. Cl.⁶ .................. H01L 31/062; H01L 31/113; H01L 27/108
[52] U.S. Cl. .................... 257/292; 257/291; 257/300
[58] Field of Search ................... 257/290, 291, 257/292, 300

[56] References Cited

U.S. PATENT DOCUMENTS

| | | |
|---|---|---|
| 4,268,845 | 5/1981 | Koike et al. . |
| 4,473,836 | 9/1984 | Chamberlain . |
| 5,625,210 | 4/1997 | Lee et al. ............................. 257/292 |
| 5,631,704 | 5/1997 | Dickinson et al. ................... 348/308 |
| 5,698,874 | 12/1997 | Hayashi ............................. 257/233 |
| 5,739,562 | 4/1998 | Ackland et al. ..................... 257/291 |

*Primary Examiner*—Ngân Van Ngô

[57] ABSTRACT

A field-effect photo-transistor, being a three-terminal photosensing electrical device, based on integrated metal oxide semiconductor (MOS) technology. The device features a high output impedance which makes it particularly suitable as a photosensor for active pixel imaging arrays. Unlike the bipolar photo-transistor, which is a device well known in the art, the field-effect phototransistor is more compatible with MOS VLSI (Very Large Scale Integration) technology by inherently being a unipolar type device. Active pixel imaging arrays based on the disclosed invention can be integrated on the same semiconductor substrate with conventional digital or mixed signal processing functions to produce single-chip image processors for video or still picture cameras.

44 Claims, 14 Drawing Sheets

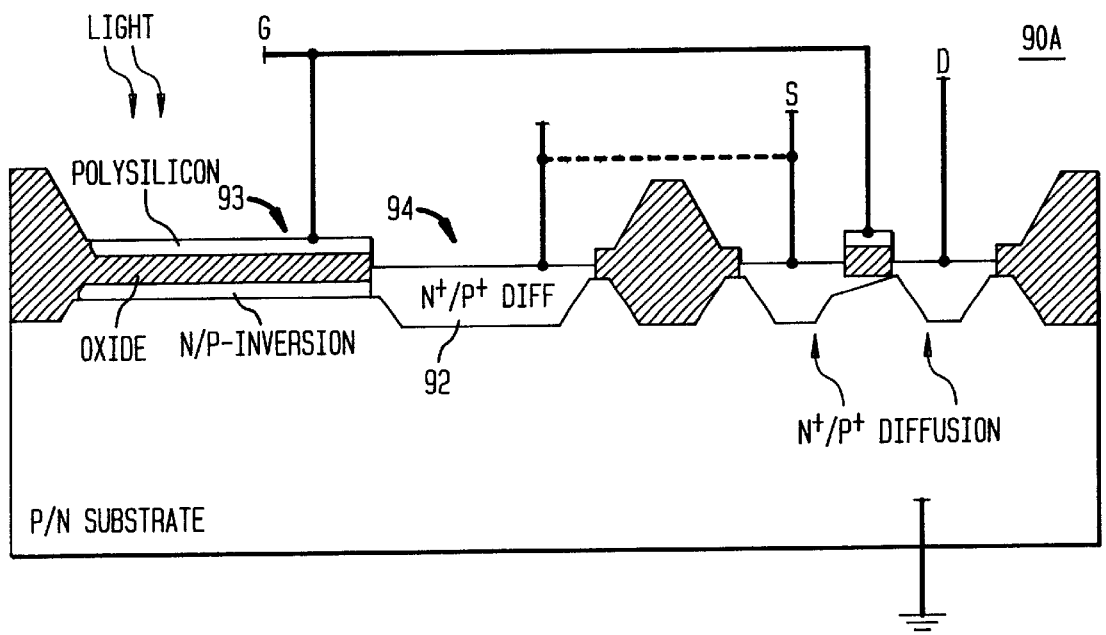
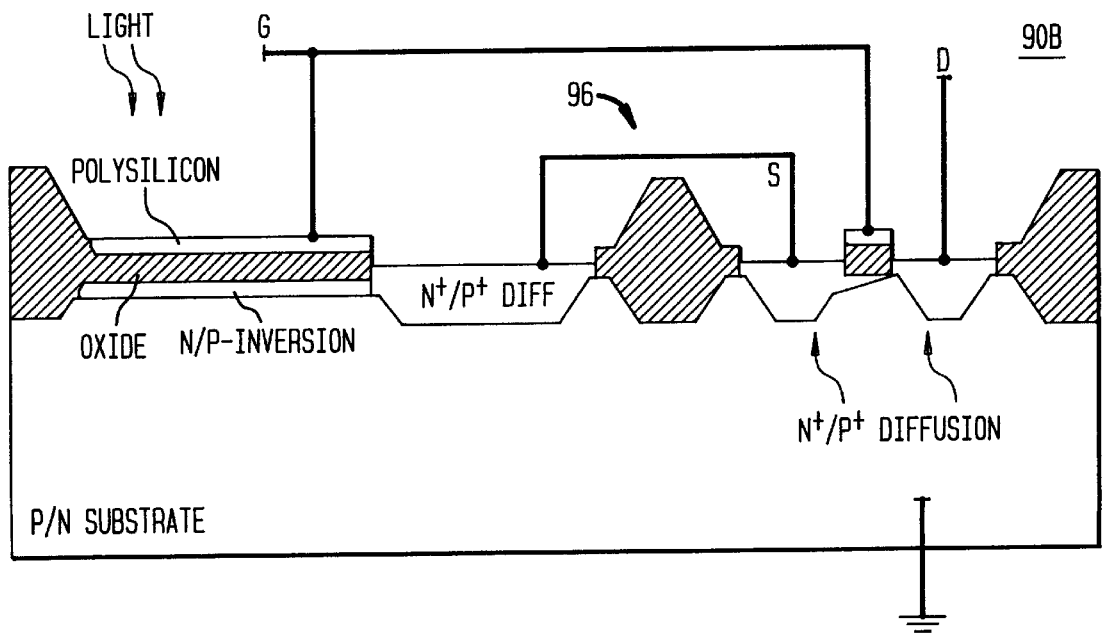

FIELD-EFFECT PHOTO-TRANSISTOR

BACKGROUND OF THE INVENTION

1. Field of the Invention

The present invention relates to semiconductor devices for image sensing and capturing, and more specifically to Very Large Scale Integration (VLSI) semiconductor technology apparatus comprising Active Pixel Sensing (APS) arrays.

2. Description of the Related Art

A photo-transistor, unlike a photo-diode, is a high output impedance (light-controlled) current source. Also, the output impedance of a photo-transistor can be rendered independent of the size of its photosensing junction, while the output impedance of a photo-diode cannot. Because of these two properties, photo-transistors are more effective sensors than photo-diodes in certain applications. Such applications include those in which the voltage output of the loaded sensor is limited by the impedance of the sensor rather than the dynamic range of the load, and those in which response linearity is important, but where response linearity is determined by the impedance of the sensor rather than the impedance of the load.

Bipolar photo-transistors have been known and used extensively in discrete and integrated circuit applications. However, it is generally difficult to isolate electrically a bipolar photo-transistor from adjacent structures in an integrated circuit. It is also generally difficult to keep the base recombination current of these transistors from reducing conversion efficiency. The photo-transistors of the present invention are inherently free of these serious limitations.

Further objects and advantages of this invention will become apparent from the detailed description which follows.

SUMMARY OF THE INVENTION

The present invention is directed to a high output impedance, three-terminal, photosensing electrical device integrated on a semiconductor substrate. The photosensing electrical device has a body terminal, a gate terminal, and a drain terminal, the body terminal being an electrical contact to the semiconductor substrate bulk.

According to one embodiment, the photosensing electrical device comprises (a) a four-terminal MOSFET (Metal Oxide Semiconductor Field-Effect Transistor) having a body terminal, a source terminal, a gate terminal, and a drain terminal and (b) a junction photo-diode having an anode side and a cathode side. If the semiconductor substrate is p type, then the anode side is the semiconductor substrate bulk and the cathode side is an n-type feature diffused into the semiconductor substrate. If the semiconductor substrate is n type, then the cathode side is the semiconductor substrate bulk and the anode side is a p-type feature diffused into the semiconductor substrate. The source terminal of the MOSFET is electrically connected to the side of the photo-diode being a feature diffused into the semiconductor substrate. If the semiconductor substrate is p type, then the MOSFET is n-channel type; otherwise, if the semiconductor substrate is n type, then the MOSFET is p-channel type. The gate terminal of the MOSFET is the gate terminal of the photosensing electrical device, the drain terminal of the MOSFET is the drain terminal of the photosensing electrical device, and the body of the MOSFET is electrically connected to the semiconductor substrate bulk.

According to another embodiment, the photosensing electrical device comprises (a) a four-terminal MOSFET having a body terminal, a source terminal, a gate terminal, and a drain terminal and (b) an MOS photogate. If the semiconductor substrate is p type, then the MOSFET is n-channel type; otherwise, if the semiconductor substrate is n type, then the MOSFET is p-channel type. The MOS photogate comprises (1) an MOS photo-capacitor sub-structure having a substrate side and a field-plate side and (2) a junction-diode sub-structure having an anode side and a cathode side. As to the MOS photo-capacitor sub-structure, the dielectric medium is a thin (gate) dielectric layer, the substrate side is the semiconductor substrate bulk, the field plate side is a conducting thin-film layer, and the combination of thin dielectric layer and conducting thin-film layer are adequately transparent to a target portion of incident-light spectrum. As to the junction-diode sub-structure, if the semiconductor substrate is p type, then the anode side is the semiconductor substrate bulk and the cathode side is an n-type feature diffused into the semiconductor substrate; otherwise, if the semiconductor substrate is n type, then the cathode side is the semiconductor substrate bulk and the anode side is a p-type feature diffused into the semiconductor substrate. The diffused side of the junction-diode sub-structure abuts the photo-capacitor sub-structure such that the space-charge region of the junction-diode sub-structure and the space-charge region, forming in the semiconductor substrate side of the photo-capacitor sub-structure when the photo-capacitor is biased into inversion or depletion, merge into one contiguous space-charge region. The body of the MOSFET is electrically connected to the semiconductor substrate bulk. The source terminal of the MOSFET is electrically connected to the diffused side of the junction diode sub-structure. The gate terminal of the MOSFET is electrically connected to the field plate side the photo-capacitor sub-structure. The drain terminal of the MOSFET is the drain terminal of the photosensing electrical device and the gate terminal of the MOSFET is the gate terminal of the photosensing electrical device.

According to yet another embodiment, the photosensing electrical device comprises (a) an MOS photo-capacitor sub-structure having a semiconductor substrate side and a field-plate side and (b) a junction-diode sub-structure having an anode side and a cathode side. The substrate side of the photo-capacitor sub-structure is separated from the field-plate side by a thin (gate) dielectric layer, where the substrate side is the semiconductor substrate bulk and the field plate side is a conducting thin-film layer. The combination of thin dielectric layer and conducting thin-film layer are adequately transparent to a target portion of incident-light spectrum. If the semiconductor substrate is p type, then the anode side is the semiconductor substrate bulk and the cathode side is an n-type feature diffused into the semiconductor substrate; otherwise, if the semiconductor substrate is n type, then the cathode side is the semiconductor substrate bulk and the anode side is a p-type feature diffused into the semiconductor substrate. The gate terminal of the photosensing electrical device is an electrical contact to the field plate of the photo-capacitor sub-structure. The drain terminal of the photosensing electrical device is an electrical contact to the diffused side of the junction-diode sub-structure. The diffused side of the junction-diode sub-structure abuts the photo-capacitor sub-structure such that the space-charge region of the junction-diode sub-structure and the space-charge region, forming in the semiconductor substrate side of the photo-capacitor sub-structure when the photo-capacitor is biased into inversion or depletion, merge into one contiguous space-charge region. The photo-capacitor sub-structure is divided into two regions, each inverting at a different threshold voltage. If the semiconductor substrate is p-type, then the junction-diode sub-structure abuts only the region of the photo-capacitor sub-structure with the (algebraically) higher threshold voltage; otherwise, if the semiconductor substrate is n-type, then the junction-diode sub-structure abuts only the region of the photo-capacitor sub-structure with the (algebraically) lower threshold voltage.

According to still another embodiment, the photosensing electrical device comprises (a) an MOS photo-capacitor sub-structure having a semiconductor substrate side and a field-plate side and (b) a junction-diode sub-structure having an anode side and a cathode side. The substrate side of the photo-capacitor sub-structure is separated from the field-plate side by a thin (gate) dielectric layer, where the substrate side is the semiconductor substrate bulk and the field-plate side is a conducting thin-film layer. The combination of thin dielectric layer and conducting thin-film layer are adequately transparent to a target portion of incident-light spectrum. If the semiconductor substrate is p type, then the anode side is the semiconductor substrate bulk and the cathode side is an n-type feature diffused into the semiconductor substrate; otherwise, if the semiconductor substrate is n type, then the cathode side is the semiconductor substrate bulk and the anode side is a p-type feature diffused into the semiconductor substrate. The gate terminal of the photosensing electrical device is an electrical contact to the field plate of the photo-capacitor sub-structure. The drain terminal of the photosensing electrical device is an electrical contact to the diffused side of the junction-diode sub-structure. The diffused side of the junction-diode sub-structure abuts the photo-capacitor sub-structure such that the space-charge region of the junction-diode sub-structure and the space-charge region, forming in the semiconductor substrate side of the photo-capacitor sub-structure when the photo-capacitor is biased into inversion or depletion, merge into one contiguous space-charge region. The photo-capacitor sub-structure is divided into one or more regions, each inverting at a different threshold voltage. If the semiconductor substrate is p-type, then the junction-diode sub-structure abuts only the region of the photo-capacitor sub-structure with the (algebraically) highest threshold voltage; otherwise, if the semiconductor substrate is n-type, then the junction-diode sub-structure abuts only the region of the photo-capacitor sub-structure with the (algebraically) lowest threshold voltage.

BRIEF DESCRIPTION OF THE DRAWINGS

Several objects, features, and advantages of the present invention will become more fully apparent from the following detailed description, the appended claims, and the accompanying drawings in which:

FIGS. 1A to 16B show depictions of photofets, according to different embodiments of the present invention.

DETAILED DESCRIPTION

The present invention is directed to field-effect photo-transistors, also known as photofets, that are fabricated and used in the context of standard, digital or mixed-signal, complementary metal oxide semiconductor (CMOS) integrated circuit (IC) technology. One basic difference between bipolar transistors and field-effect transistors is that the functionality of the former is minority-carrier based, while the functionality of the latter is majority-carrier based. The isolation and efficiency problems of bipolar photo-transistors result from the fact that their functionality is also minority-carrier based. According to the present invention, photo-transistors are field-effect photo-transistors, whereby majority-carrier-based functionality overcomes the isolation and efficiency problems of bipolar photo-transistors.

Structure

Figure 1A:
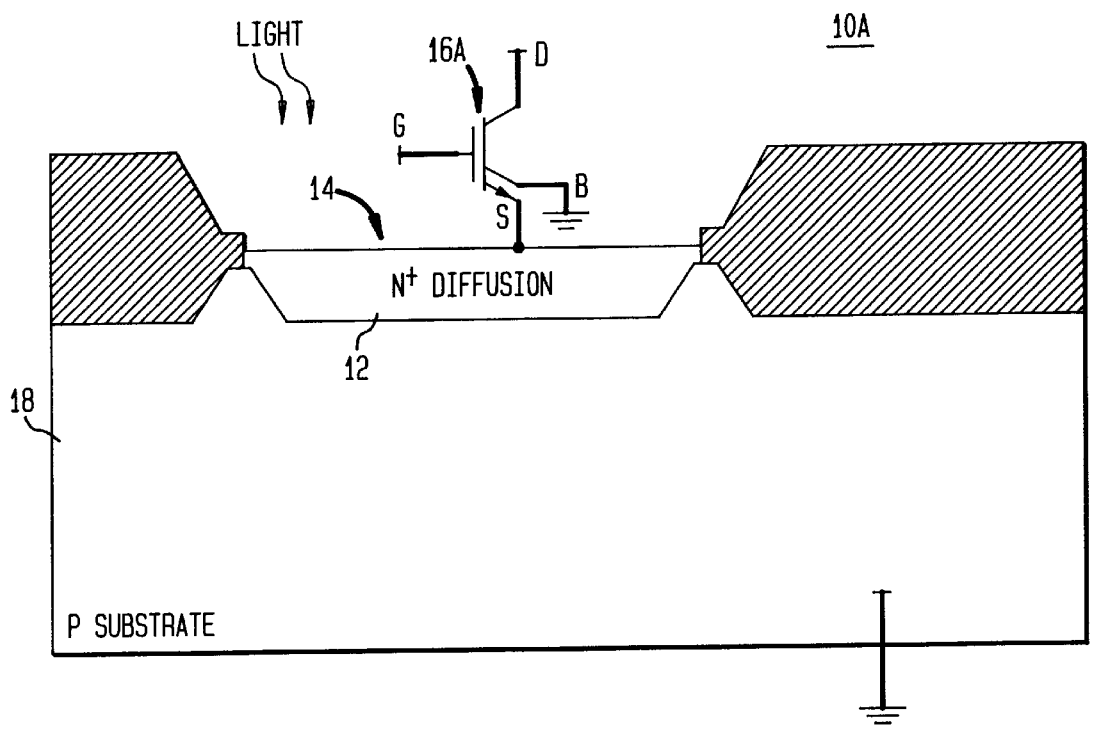

FIG. 1A shows a depiction of photofet 10A, according to one embodiment of the present invention. Photofet 10A is a high output impedance, three-terminal, photosensing electrical device integrated on a semiconductor substrate 18. Photofet 10A has a body terminal, a gate terminal, and a drain terminal, the body terminal being an electrical contact to the semiconductor substrate bulk 18. In FIG. 1A (and all other photofet figures) the body terminal is shown connected to the user's reference (ground) node. Photofet 10A comprises a symbolically depicted four-terminal MOS (insulated gate) field-effect transistor (FET) 16A and a structurally (cross-sectional view) depicted junction photo-diode 14. Junction photo-diode 14 operates as a photosensing diode (i.e., as a diode availing its junction for sensing incident light). As used in this specification, the term "MOS Field-Effect" should not be interpreted to refer exclusively to Metal Oxide Semiconductor Field-Effect structures. Rather, in conformance with accepted practice, the term "MOS Field-Effect" should be interpreted to be equivalent to the more general term "Insulated Gate (IG) Field-Effect."

MOSFET 16A has a body terminal B, a source terminal S, a gate terminal G, and a drain terminal D. The body terminal B of MOSFET 16A is connected to the semiconductor substrate bulk 18 and the source terminal S of MOSFET 16A is electrically connected to the diffused side 12 of junction photo-diode 14. The gate terminal G of MOSFET 16A is the gate terminal of photofet 10A and the drain terminal D of MOSFET 16A transistor is the drain terminal of photofet 10A.

In the implementation shown in FIG. 1A, the semiconductor substrate 18 of photofet 10A is p-type. In that case, MOSFET 16A is n-channel type, the anode side of junction photo-diode 14 is the semiconductor substrate bulk 18, and the cathode side is an n-type impurity-diffusion feature 12 diffused into the semiconductor substrate 18.

Figure 1B:
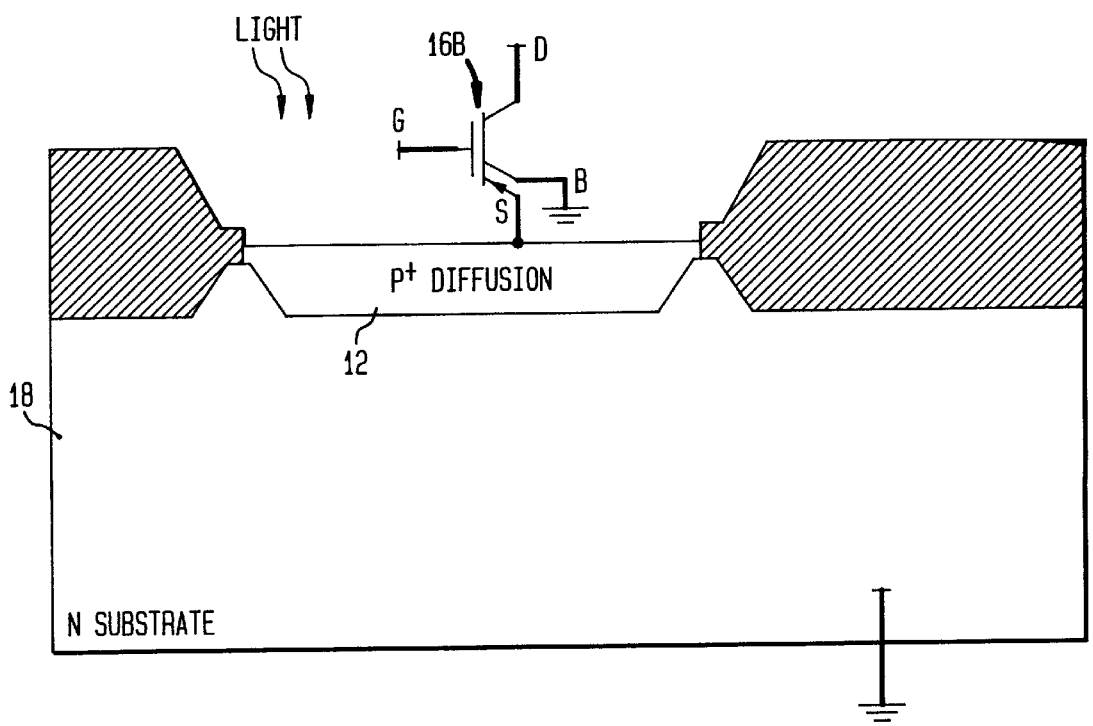

FIG. 1B shows a depiction of photofet 10B, according to an alternative embodiment of the present invention. Photofet 10B is similar to photofet 10A of FIG. 1A, except that, in this implementation, the semiconductor substrate is n-type, the MOSFET (16B) is p-channel type, the cathode side of junction photo-diode 14 is the semiconductor substrate bulk 18, and the anode side is a p-type impurity-diffusion feature 12 diffused into the semiconductor substrate 18.

Photofets 10A and 10B may also comprise one or more thin-film photo-mask layers (not shown in FIGS. 1A and 1B) over one or more regions of the photofets rendering such regions photo-inactive, while leaving other regions of the photofets as photo-active. In addition, photofets 10A and 10B may comprise one or more thin-film color-filter layers (not shown in FIGS. 1A and 1B) over one or more of the photo-active regions of the photofets restricting receptivity of the photofets to light of a specified spectral range (i.e., a specific frequency band of the electromagnetic spectrum). It will be further understood that photofets 10A and 10B may also have one or more thin-film overlay features (not shown in FIGS. 1A and 1B) for conduction, surface passivation, planarization, or interconnection. These overlay features are typically non-masking over active regions of the photosensing electrical device.

Photofets 10A and 10B generate a photocurrent in response to, and in proportion to, light absorbed in the space-charge region of junction photo-diode 14, after entering the structure from the top as shown in FIGS. 1A and 1B. Accordingly, the efficiency of photofets 10A and 10B is directly related to the width of this space-charge region, and bears an inverse relationship to the effective distance of this space charge region from the top surface of the structure. Photons absorbed in this space-charge region generate electron-hole pairs. The photofet's response photocurrent is the leakage (reverse) current that these electron-hole pairs cause to flow across the junction diode and through the external circuit (not shown) that supplies diode bias. The external circuit is designed to maintain the junction diode reverse biased during operation, and is discussed later in this specification.

In photofets 10A and 10B, it may be advantageous to allow the MOSFETs (16A and 16B) to photo-leak (i.e., to let light penetrate into any portion of their body-junction and cause it to leak). Such photo-leakage contributes constructively to the photocurrent output of the photofets.

Figure 2A:
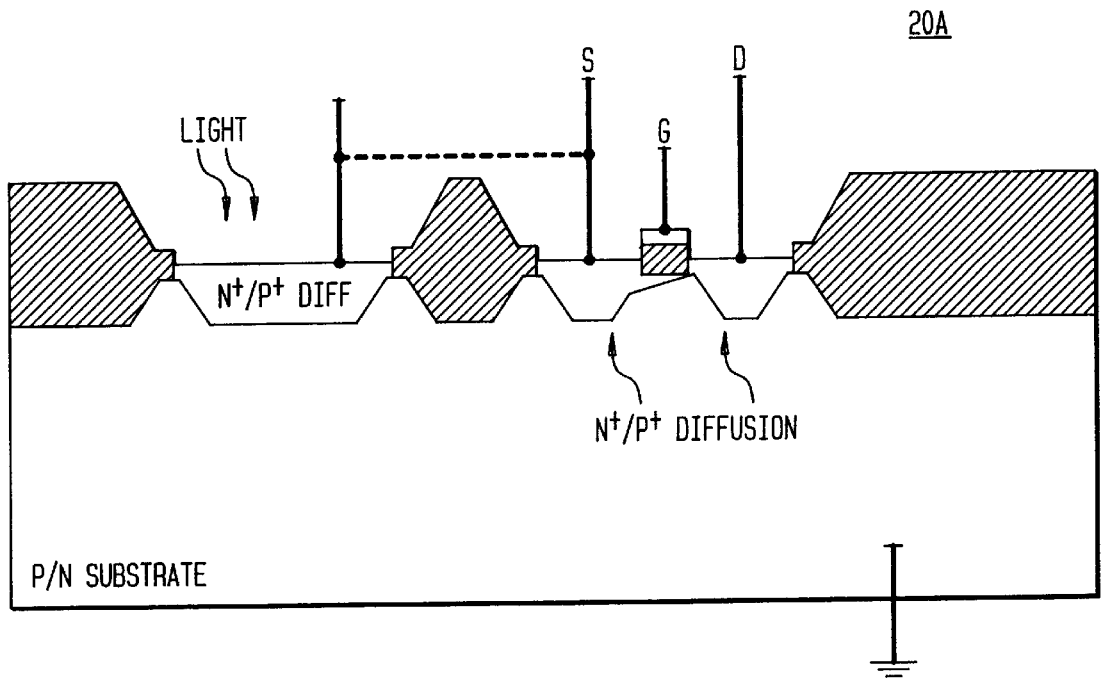

FIG. 2A shows a depiction of photofet 20A, according to another embodiment of the present invention. In FIG. 2A (as well as in other figures), two different implementations of the photofet are represented in the same figure: one having a p-type substrate and n-type diffusion regions and the other having an n-type substrate and p-type diffusion regions. As such, photofet 20A is similar to photofets 10A and 10B of FIGS. 1A and 1B, except that FIG. 2A shows cross-sectional views of both the junction photo-diode structure and one possible MOSFET structure. In this embodiment, the substrate side of the photo-diode and the body feature of the MOSFET are the same electrical region of the substrate, namely the semiconductor substrate bulk. Accordingly, the interconnection between the body terminal of the MOSFET and the substrate bulk is implicitly achieved.

In FIG. 2A, the dashed line indicates an interconnection which is to be realized between the two regions. For example, the interconnection could be realized by thin film (see, e.g., FIG. 2B) or by merging the two diffused features (see, e.g., FIG. 3).

Figure 2B:
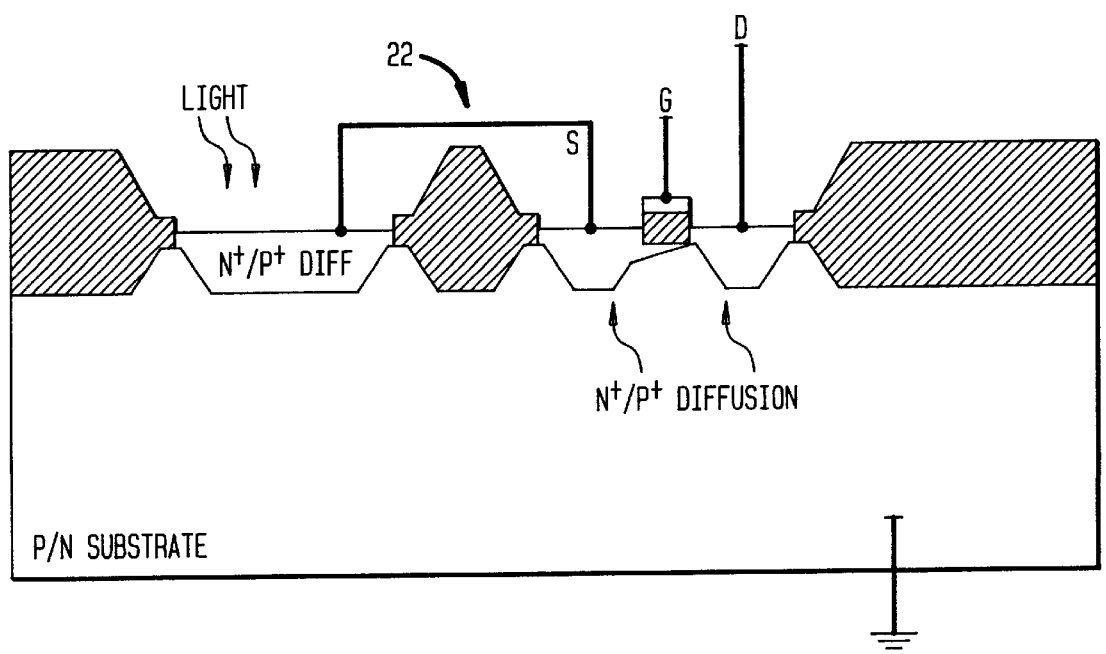

FIG. 2B shows a depiction of photofet 20B, according to another embodiment of the present invention. Photofet 20B is similar to photofet 20A of FIG. 2A, except that, in this embodiment, the source terminal of the MOSFET and the diffused side of the photo-diode are specifically interconnected by an integrated thin-film conductor 22 (depicted in FIG. 2B as a solid line).

Figure 3:
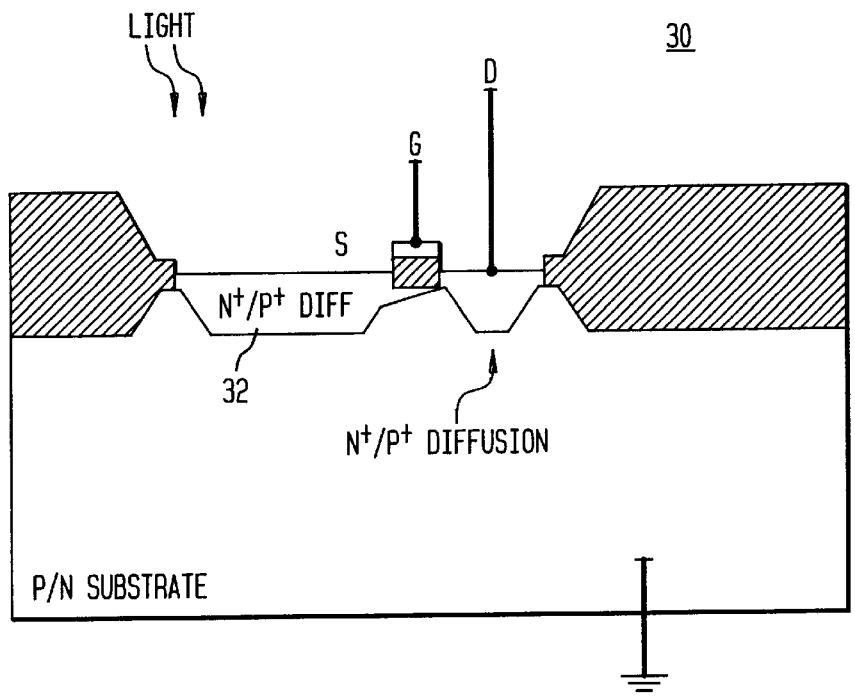

FIG. 3 shows a depiction of photofet 30, according to another embodiment of the present invention. Photofet 30 is similar to photofet 20A of FIG. 2A, except that, photofet 30 further merges the source of the MOS field-effect transistor with the diffused side of the junction photo-diode, as the source of the MOSFET and the diffused side of the junction photo-diode are both either n-type or p-type features. In this embodiment, the source feature of the MOSFET and the diffused side of the junction photo-diode are merged into one physically and electrically contiguous region 32. This merging of the MOSFET and the junction photo-diode in photofet 30 is considered advantageous (i.e., smaller size and one fewer interconnection), although it is not functionally necessary.

Figure 4A:
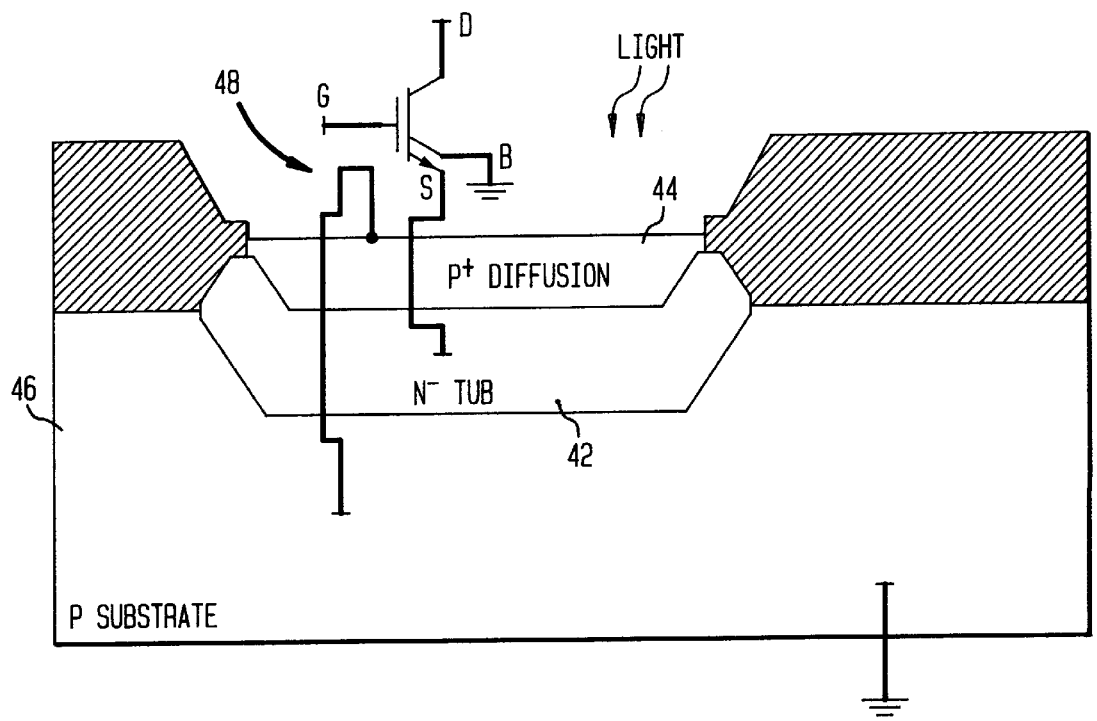
Figure 4B:
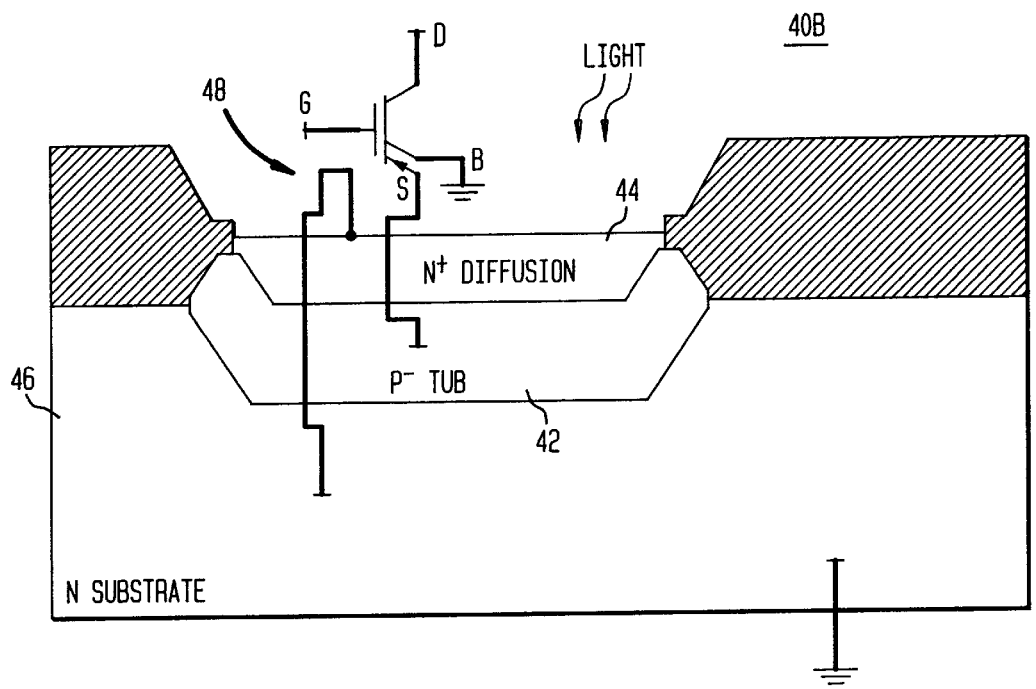

FIGS. 4A–B show depictions of photofets 40A and 40B, according to other embodiments of the present invention. Photofets 40A and 40B are similar to photofets 10A and 10B of FIGS. 1A and 1B, respectively, except that, in these embodiments, the efficiency and spectral response of the device is enhanced by allowing diode folding. In the context of a standard CMOS technology, when the substrate is p-type as in FIG. 4A, it is possible to make a folded photo-diode by diffusing a p-type source feature in an n-tub region. Similarly, when the substrate is n type as in FIG. 4B, a folded photo-diode can be made by diffusing an n-type source feature in a p-tub region.

In either case, the two stacked junctions that result are put to photosensing in parallel. That is, the additional junction increases the sensitivity of the device by effectively increasing the width of the photosensing junction, since light is made to traverse first the junction between the tub feature and its overlaying diffusion, and then residually the junction between the tub feature and its underlying substrate. Sensitivity increases with increasing junction width for the reasons discussed in connection with photofets 10A and 10B of FIGS. 1A and 1B. Additionally, there can be a spectral response advantage, since the n-tub/substrate junction, which is further from the surface, is likely to respond better in the red side of the spectrum, while the n-tub/source junction, which is closer to the surface, is likely to respond better in the blue side.

In particular, in photofets 40A and 40B, the diffused side of the junction photo-diode is a deep, lightly doped, CMOS tub-type diffused feature 42. In addition, photofets 40A and 40B have a heavily doped, CMOS source-type feature 44 diffused over the CMOS tub-type feature region 42. The source-type feature 44 is defined by a dopant of opposite type from that used for the tub-type feature 42, such that two stacked photo-diode junctions are formed, one junction forming at the interface between the tub-type feature 42 and the semiconductor substrate bulk 46, and one junction forming at the interface between the tub-type feature 42 and the source-type feature 44.

The two junctions are arranged such that light incident on the photosensing electrical device successively reaches and traverses first the junction between the source-type feature and the tub-type feature, and then residually the junction between the tub-type feature and the semiconductor substrate bulk. The two junctions are arranged to be electrically connected in parallel. Accordingly, the source-type diffused region of the junction photo-diode gets connected to the semiconductor substrate bulk, as shown by line 48 in FIGS. 4A and 4B.

Figure 5A:
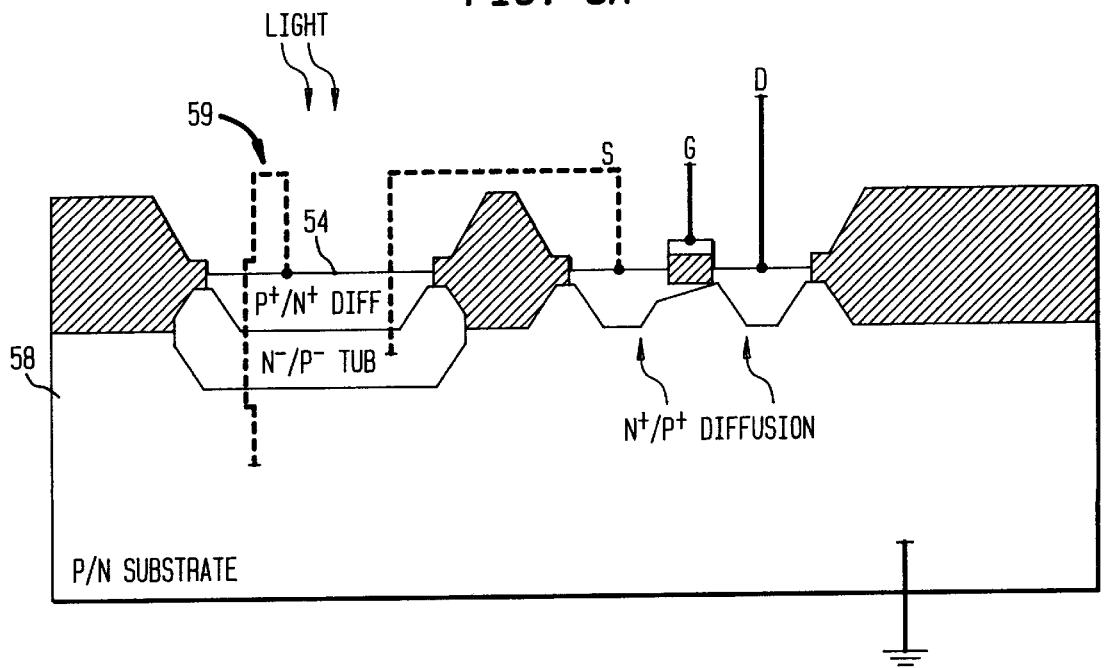

FIG. 5A shows a depiction of photofet 50A, according to another embodiment of the present invention. Photofet 50A is similar to photofet 40A of FIG. 4A, except that FIG. 5A shows cross-sectional views of both the junction photo-diode structure and one possible MOSFET structure. In this embodiment, the substrate side of the photo-diode and the body feature of the MOSFET are the same electrical region of the substrate, namely the semiconductor substrate bulk. Accordingly, the interconnection between the body terminal of the MOSFET and the substrate bulk is implicitly achieved.

As already discussed in connection with photofets 40A and 40B of FIGS. 4A and 4B, the source-type diffused region 54 of the junction photo-diode gets connected to the semiconductor substrate bulk 58. This electrical connection, shown by dashed line 59 in FIG. 5A, may be accomplished using an integrated thin-film conductor, a vertical via hole in the tub-type region, or some other geometrical arrangement such as shown in FIGS. 7A and 7B.

Figure 5B:
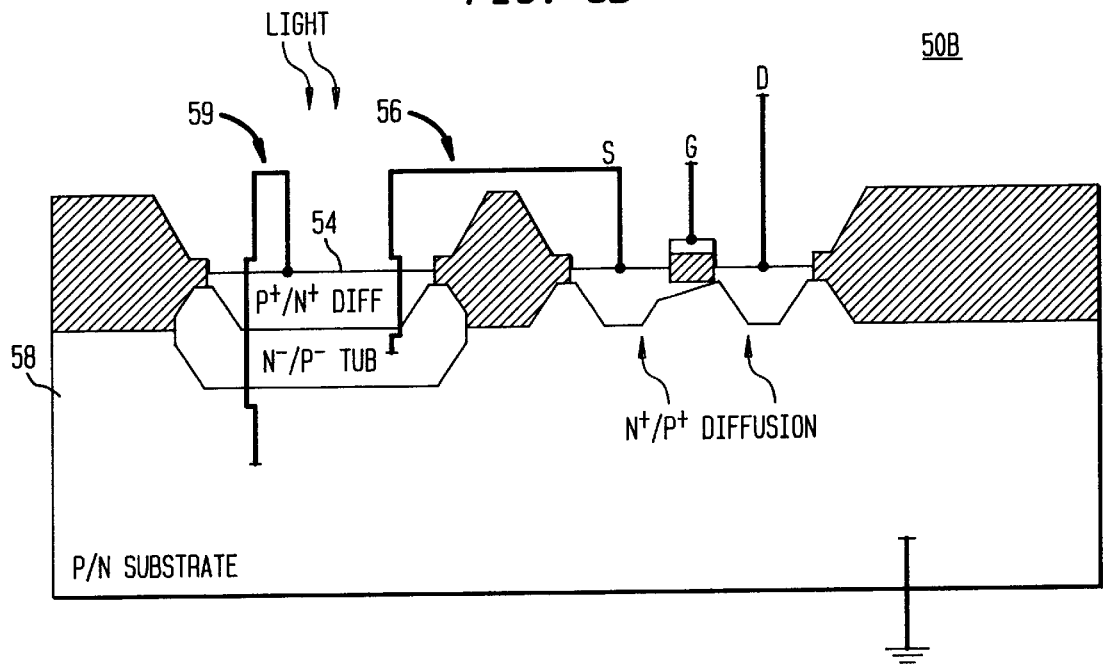

FIG. 5B shows a depiction of photofet 50B, according to another embodiment of the present invention. Photofet 50B is similar to photofet 50A of FIG. 5A, except that, in this embodiment, the interconnection 56 between the source terminal S of the MOSFET and the tub-type feature 52 of the junction photo-diode as well as the interconnection 59 between the source-type diffusion feature 54 and the semiconductor substrate bulk 58 are specifically disposed as integrated thin-film interconnections (depicted in FIG. 5B as solid lines).

Figure 6:
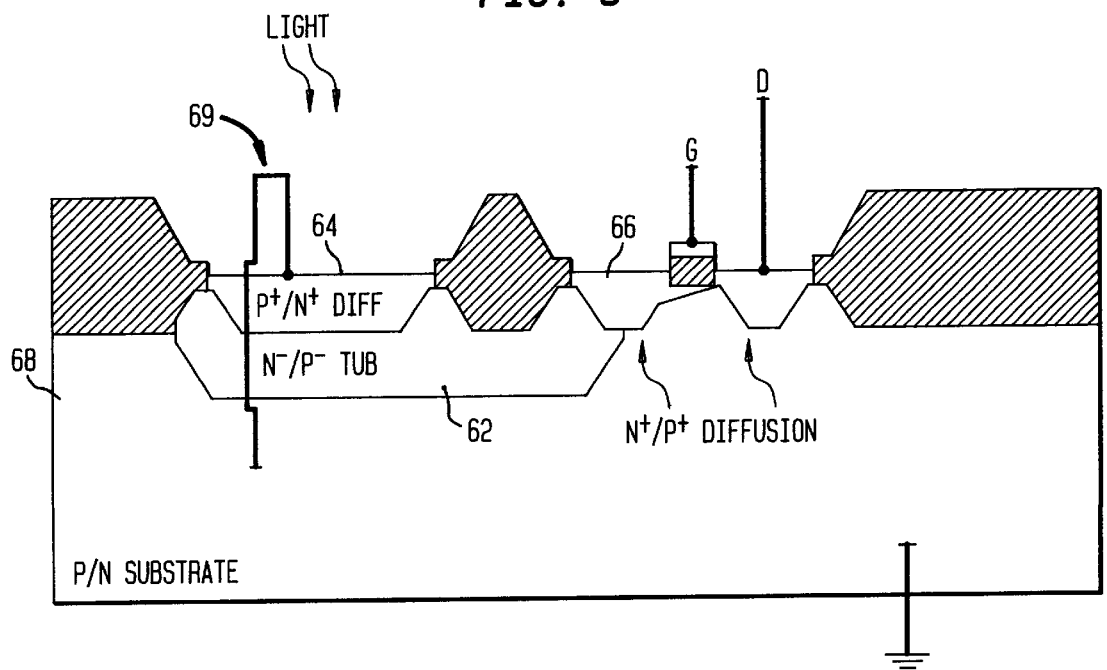

FIG. 6 shows a depiction of photofet 60, according to another embodiment of the present invention. Photofet 60 is similar to photofet 50A of FIG. 5A, except that, in this embodiment, at least a part of the source feature 66 of the MOSFET is contained in a portion of the tub-type feature 62 of the junction photo-diode not containing a source-type feature, such that the source feature of the MOSFET and the tub-type feature of the junction photo-diode are one contiguous electrical region. In addition, the interconnection 69 between the source-type diffusion feature 64 and the semiconductor substrate bulk 68 is specifically disposed as an integrated thin-film interconnection (depicted in FIG. 6 as a solid line).

Figure 7A:
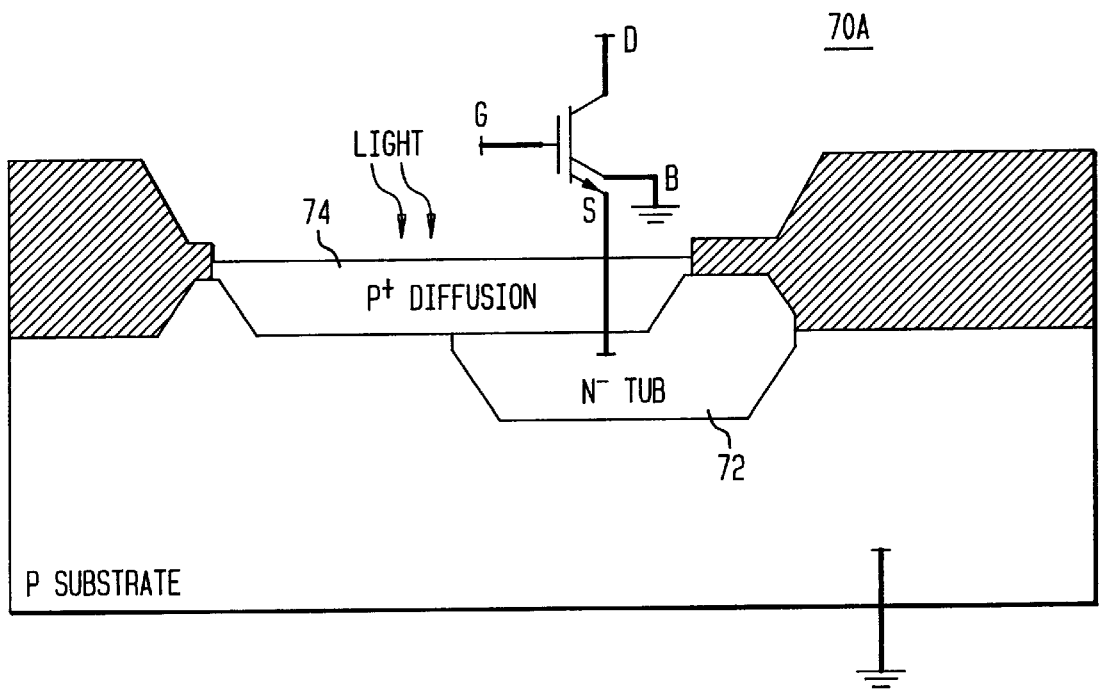
Figure 7B:
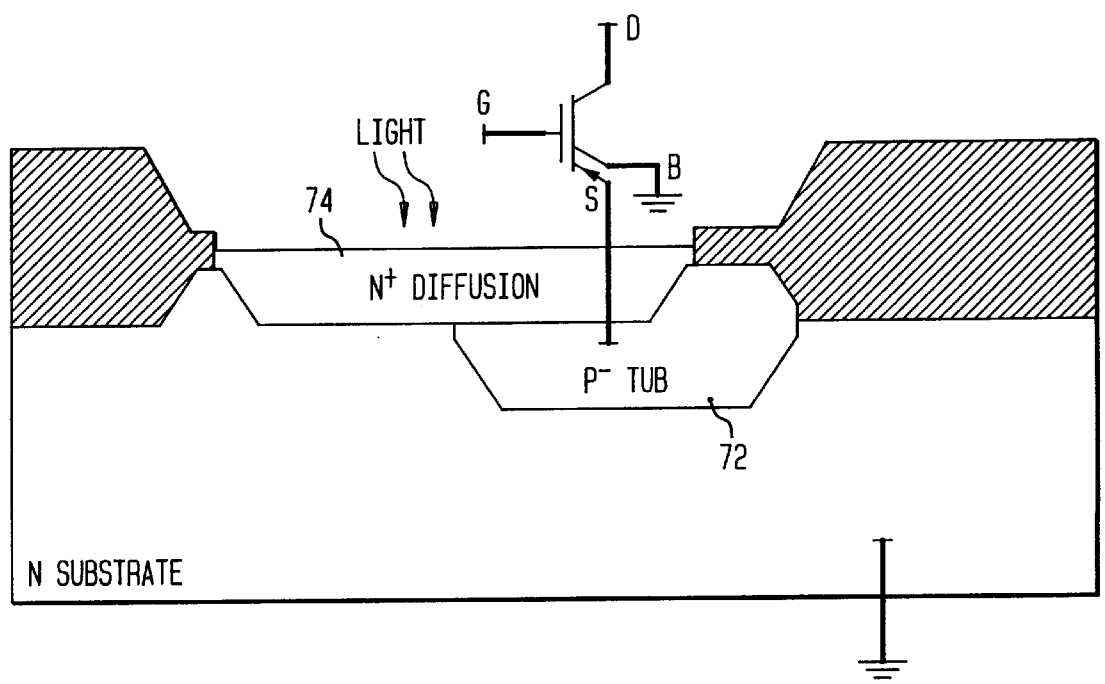

FIGS. 7A–B show depictions of photofets 70A and 70B, according to other embodiments of the present invention. Photofets 70A and 70B are similar to photofets 40A and 40B of FIGS. 4A and 4B, respectively, except that, in these embodiments, the CMOS tub-type feature 72 of the junction photo-diode underlies the source-type feature 74 of the junction photo-diode only partially, such that the source-type feature is electrically and physically a part of the semiconductor substrate bulk.

Figure 8A:
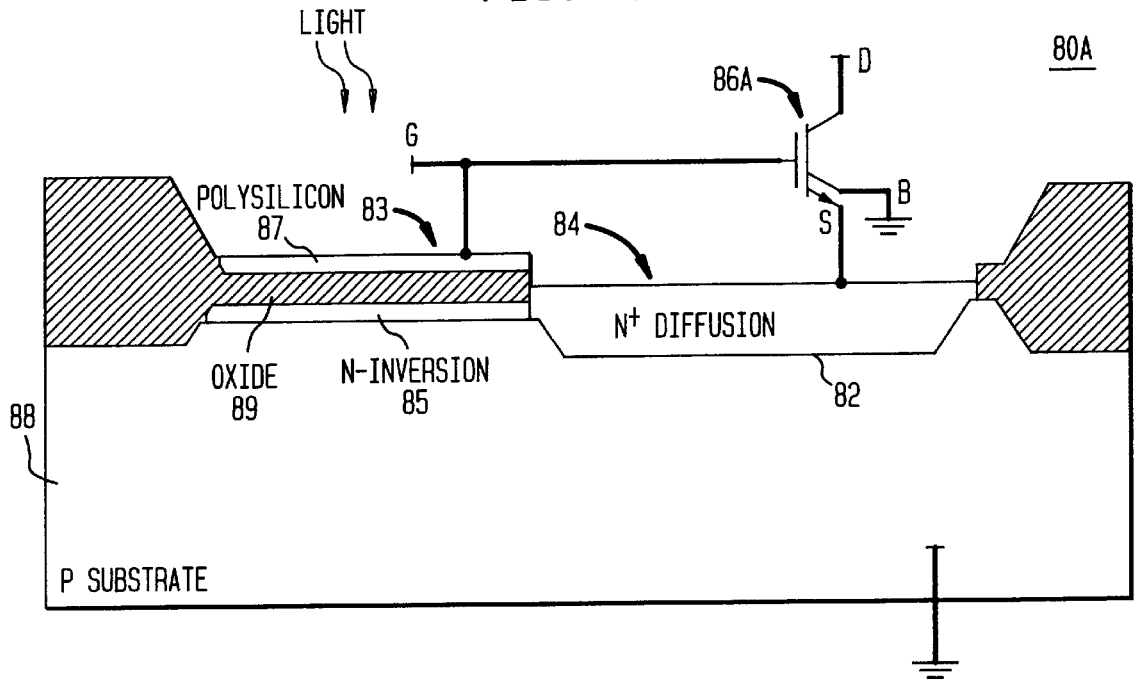

FIG. 8A shows a depiction of photofet 80A, according to another embodiment of the present invention. Photofet 80A is similar to photofet 10A of FIG. 1A, except that, in this embodiment, the photosensor is a photogate structure comprising an MOS photo-capacitor sub-structure and a junction diode sub-structure. The junction diode sub-structure may or may not be photosensing depending upon whether the superstructure allows or disallows light from reaching the diode's junction region.

In particular, photofet 80A is a high output impedance, three-terminal, photosensing electrical device integrated on a semiconductor substrate 88. Photofet 80A has a body terminal, a gate terminal, and a drain terminal, the body terminal being an electrical contact to the semiconductor substrate bulk 88. In a typical application, the body terminal is connected to the user's electrical reference node (ground).

Photofet 80A is shown to comprise a (symbolically depicted) four-terminal MOS (insulated gate) field-effect transistor 86A and an MOS photogate structurally depicted in cross-sectional view. The photogate comprises a junction diode sub-structure 84 and an MOS photo-capacitor sub-structure 83.

In the implementation shown in FIG. 8A, the semiconductor substrate 88 of photofet 80A is p-type. In that case, the anode side of junction photo-diode 84 is the semiconductor substrate bulk 88 and the cathode side is an n-type impurity-diffusion feature 82 diffused into the semiconductor substrate 88.

Figure 8B:
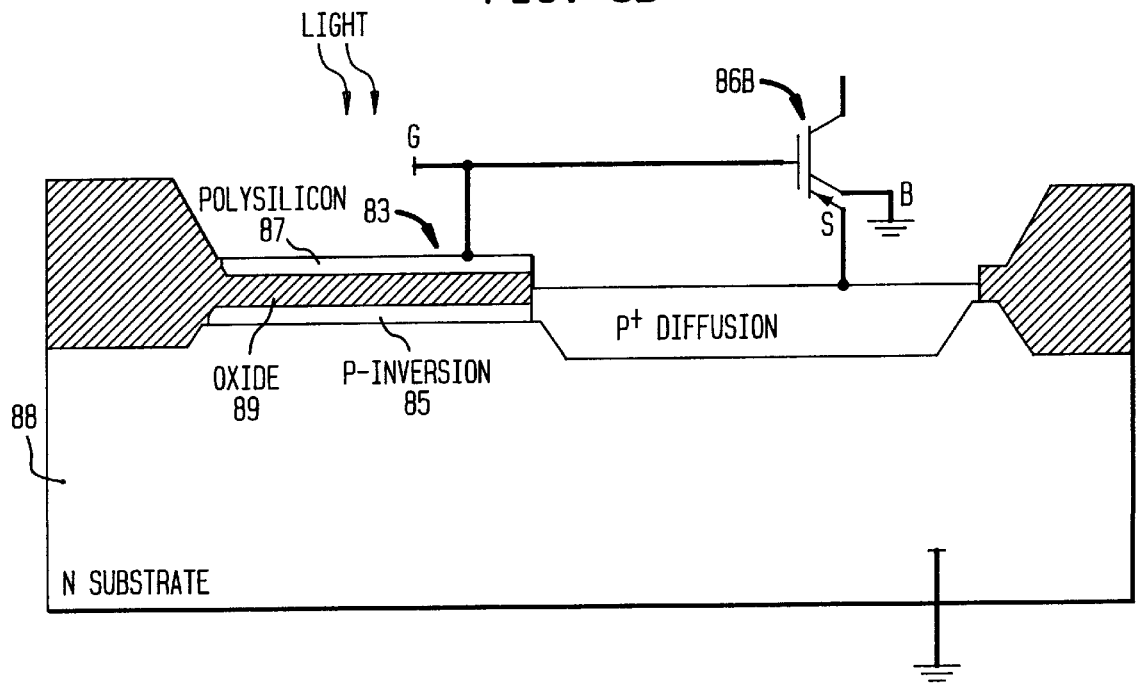

FIG. 8B shows a depiction of photofet 80B, according to another embodiment of the present invention. Photofet 80B is similar to photofet 80A of FIG. 8A, except that, in this embodiment, the semiconductor substrate is n-type, in which case, the MOSFET is p-channel type, the cathode side of junction photo-diode 84 is the semiconductor substrate bulk 88, and the anode side is a p-type feature diffused into the semiconductor substrate 88.

In both photofets 80A and 80B, the MOS photo-capacitor sub-structure comprises a thin dielectric feature 89 disposed directly over the semiconductor substrate bulk 88, and a field-plate feature 87, disposed directly over the thin dielectric feature 89.

FIGS. 8A and 8B also show an inversion layer 85 under the dielectric feature 89 (n-inversion in FIG. 8A and p-inversion in FIG. 8B). These inversion layers form during operation when the voltage across the MOS capacitor is of such magnitude and direction as to cause the surface of the semiconductor substrate to invert. The photo-capacitor goes into photosensing mode when the applied bias causes the region of the semiconductor substrate immediately under the thin dielectric feature 89 to invert or to deplete. The photo-capacitor cannot photosense when the bias applied causes this region to accumulate, because no space-charge region forms under the dielectric in that case. Accordingly, the photo-capacitor can be biased into three possible operating modes, two of which are active and one inactive. Of the two active modes, the most efficient is the one causing the semiconductor surface to invert. Also, this mode produces the lowest dark current (junction thermal leakage). In order for the device to operate consistently in this advantageous mode, it must be possible to turn the MOS transistor off without depleting or accumulating the capacitor in the course of normal operation. In order for this to be possible, the threshold voltage of the MOS transistor must differ from the threshold of the MOS capacitor appropriately, for example, by making the MOS transistor enhancement type and making the MOS capacitor depletion type, or by making both enhancement types and making the two threshold voltages unequal giving the MOS capacitor the lower threshold voltage magnitude.

MOSFET 86A has a body terminal B, a source terminal S, a gate terminal G, and a drain terminal D. The source terminal S of MOSFET 86A is electrically connected to the source terminal of the photogate, which is the diffused side 82 of the junction diode sub-structure 84. The gate terminal G of MOSFET 86A is the gate terminal of photofet 80A and is electrically connected to the field plate 87 of the photo-capacitor sub-structure 83. The drain terminal D of MOSFET 86A transistor is the drain terminal of photofet 80A.

The field plate 87 is a conducting thin-film layer, which is transparent to light. The combination of field plate 87 and thin dielectric layer 89 are adequately transparent to a target portion of incident-light spectrum allowing light directed toward photofets 80A and 80B from the top (as shown in FIGS. 8A and 8B) to reach the substrate side 88 without suffering significant attenuation. One possible material for making field plate 87 is polysilicon, which is part of the base MOS technology. However, if performance is more important than cost, another type of material can be used with better transparency or better (perhaps color selective) index of refraction. In addition, a type of reflowed glass can be used which can be shaped to have local curvature, such that the field plate acts as an optical lens.

The photosensing space-charge region under the MOS dielectric 89 may be in contact with the dielectric (MOS depletion mode) or located between a surface inversion layer and the substrate (MOS inversion mode). In either case, photons absorbed in this space-charge region generate electron-hole pairs which get collected by the adjacent junction diode 84. Leakage (reverse) current that consequently flows across the junction diode and through the external circuit which supplies diode-bias is the response photocurrent. The external circuit is designed to keep the junction diode reverse biased during operation, as discussed later in this specification. The junction diode, if made photo-leaky (for example, by making it possible for light to reach its space charge region), will further contribute to this device's response photocurrent.

The structural adjacency of the junction diode sub-structure 84 to the photo-capacitor sub-structure 83 in photofet 80A is so intended as to provide that during operation the space-charge region of the junction diode sub-structure 84 and the space-charge region of the photo-capacitor sub-structure 83 are contiguous regions, and further, so that, when an inversion layer 85 exists under the dielectric layer 89 of the photo-capacitor sub-structure 83, the diffused side 82 of the junction diode sub-structure 84 and the inversion layer 85 of the photo-capacitor sub-structure 83 are not only electrically, but also physically, in contact. An inversion layer 85 may exist under the thin dielectric layer 89 during the entire cycle of operation, or only during a portion of it, as biasing conditions and the MOS threshold values permit.

In general, the geometric features that render MOSFET 86A, the junction diode sub-structure 84, the photo-capacitor sub-structure 83, and their topological adjacencies, may involve encircling features, both planar and three-dimensional, and also parallel arraying. For example, the source, gate, and drain terminals of MOSFET 86A may encircle the photogate device. In particular, the gate and drain features of transistor 86A may encircle the photogate device, and vice versa.

FIG. 9A shows a depiction of photofet 90A, according to another embodiment of the present invention. Photofet 90A is similar to photofet 80A of FIG. 8A, except that FIG. 9A shows cross-sectional views of both the photogate structure and one possible MOSFET structure. In this embodiment, the substrate side of the photogate and the body feature of the MOSFET are the same electrical region of the substrate, namely the semiconductor substrate bulk. Accordingly, the interconnection between the body terminal of the MOSFET and the substrate bulk is implicitly achieved.

FIG. 9B shows a depiction of photofet 90B, according to another embodiment of the present invention. Photofet 90B is similar to photofet 90A of FIG. 9A, except that, in this embodiment, the source terminal S of the MOSFET and the diffused side of the photo-diode are specifically interconnected by an integrated thin-film conductor 96 (depicted in FIG. 9B as a solid line).

Figure 10:
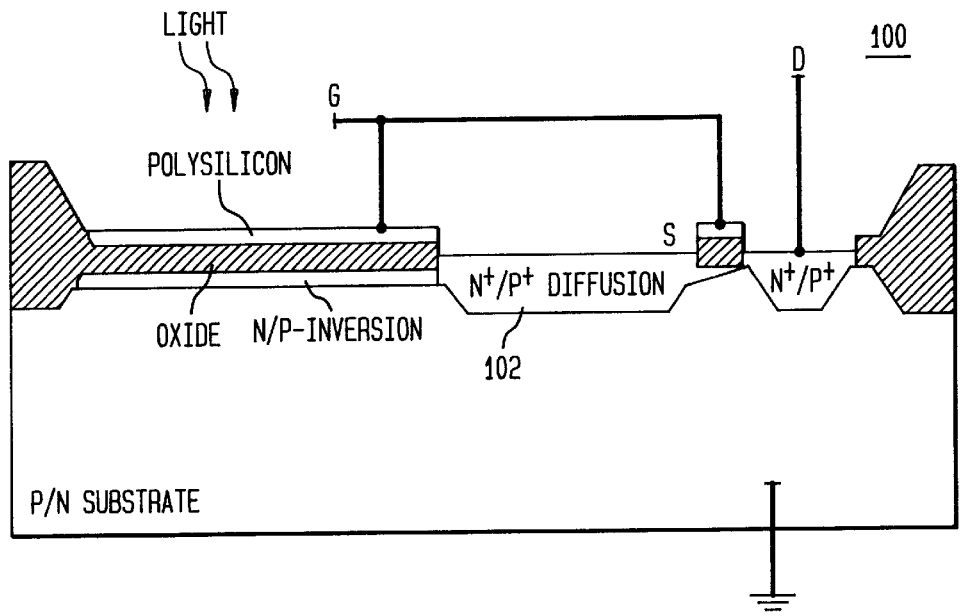

FIG. 10 shows a depiction of photofet 100, according to another embodiment of the present invention. Photofet 100 is similar to photofet 90A of FIG. 9A, except that, photofet 100 further merges the source of the MOS field-effect transistor with the junction photo-diode, as the source of the MOSFET and the diffused side of the junction photo-diode are both either n-type or p-type devices. In this embodiment, the source feature of the MOSFET and the diffused side of the junction photo-diode are merged into one physically and electrically contiguous region 102. This merging of the MOSFET and the junction photo-diode in photofet 100 is considered advantageous (i.e., smaller size and one fewer interconnection), although it is not functionally necessary.

Figure 11A:
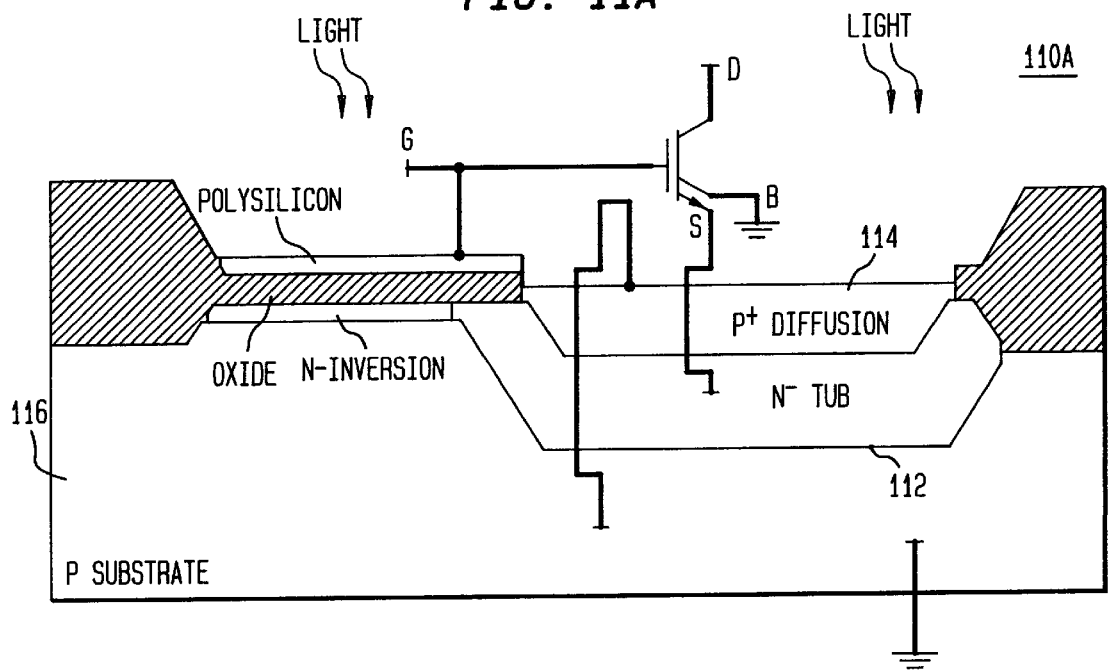
Figure 11B:
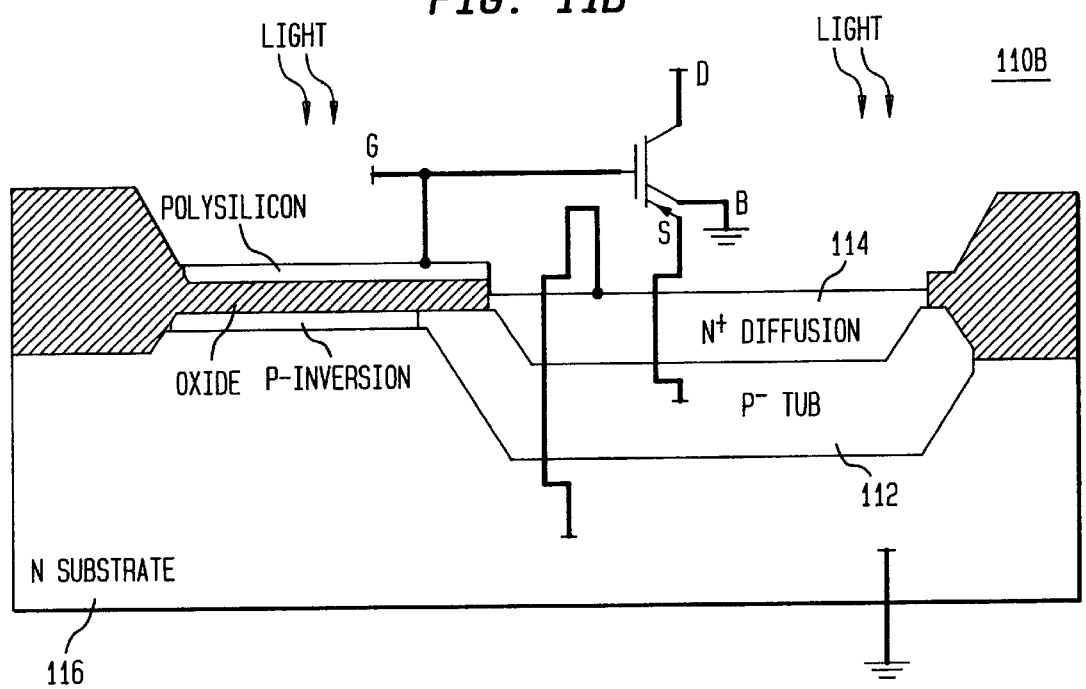

FIGS. 11A–B show depictions of photofets 110A and 110B, according to other embodiments of the present invention. Photofets 110A and 110B are similar to photofets 80A and 80B of FIGS. 8A and 8B, respectively, except that, in these embodiments, the efficiency and spectral response of the device is enhanced by specifically allowing the junction-diode substructure to photosense, and by further allowing diode folding. In photofets 110A and 110B, the diffused side of the junction diode is a deep, lightly doped, CMOS tub-type diffused feature 112. In addition, photofets 110A and 110B have a heavily doped, CMOS source-type feature 114 diffused over the CMOS tub-type feature region 112. The source-type feature 114 is defined by a dopant of opposite type from that used for the tub-type feature 112, such that two stacked photo-diode junctions are formed, one junction forming at the interface between the tub-type feature 112 and the semiconductor substrate bulk 116, and one junction forming at the interface between the tub-type feature 112 and the source-type feature 114.

Figure 14A:
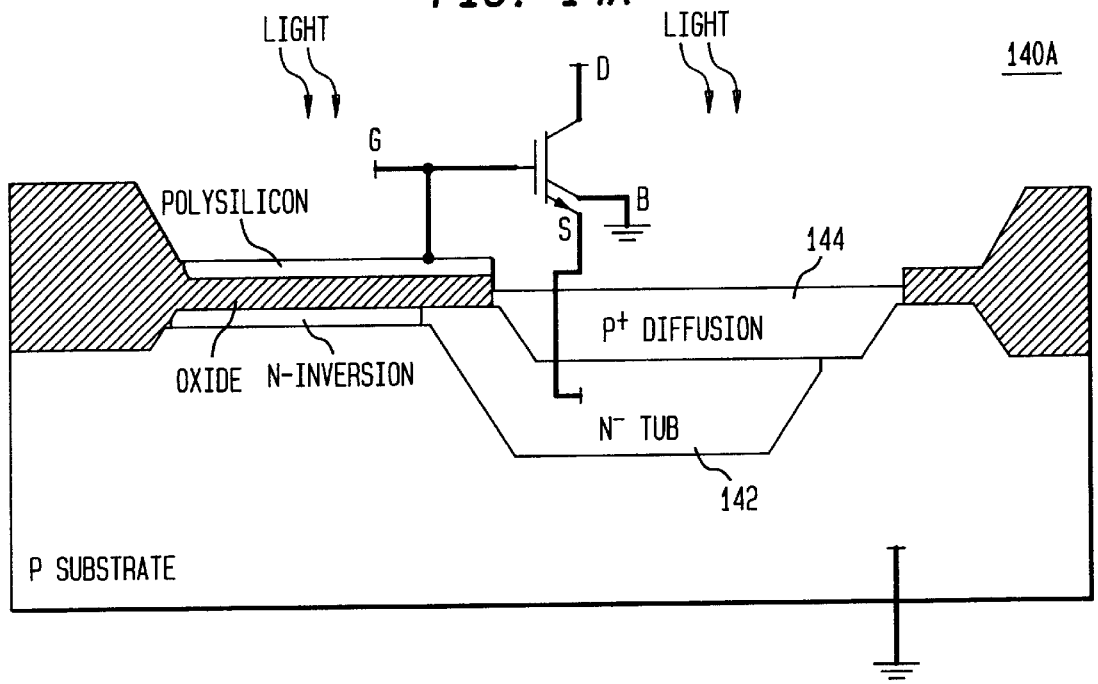
Figure 14B:
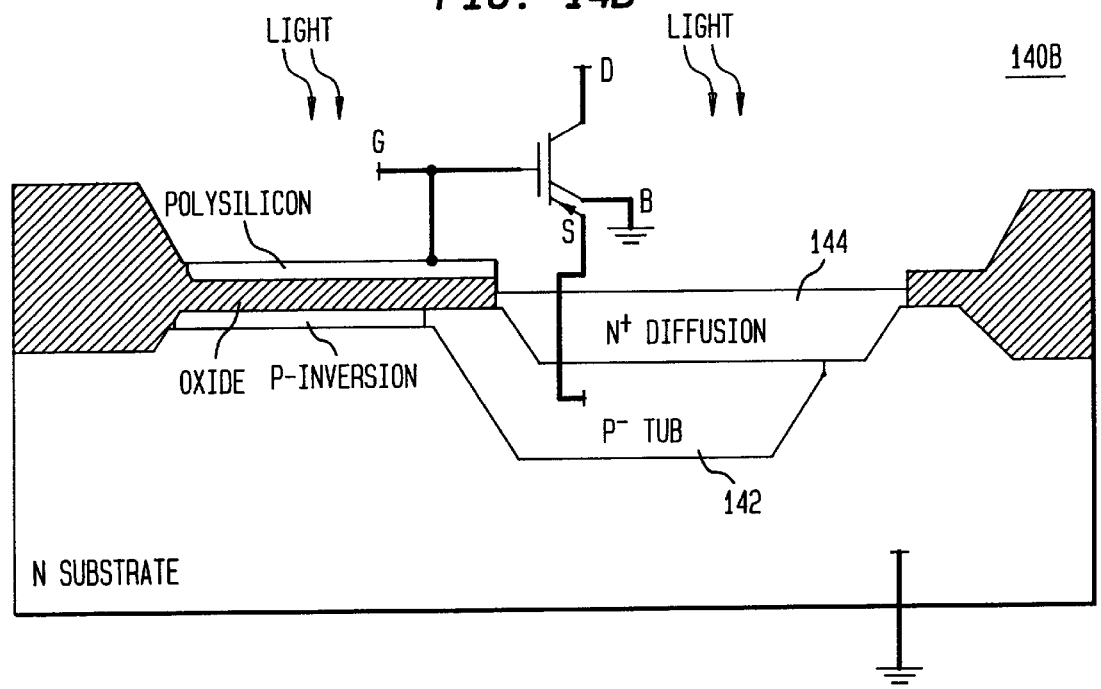

The two junctions are arranged such that light incident on the photosensing electrical device successively reaches and traverses first the junction between the source-type feature and the tub-type feature, and then the junction between the tub-type feature and the semiconductor substrate bulk. The two junctions are arranged to be electrically connected in parallel. Accordingly, the source-type diffused region of the junction photo-diode gets connected to the semiconductor substrate bulk. This electrical connection may be accomplished using an integrated thin-film conductor layer, a vertical via hole in the tub-type region, or some other geometrical arrangement as shown in FIGS. 14A and 14B.

Figure 12A:
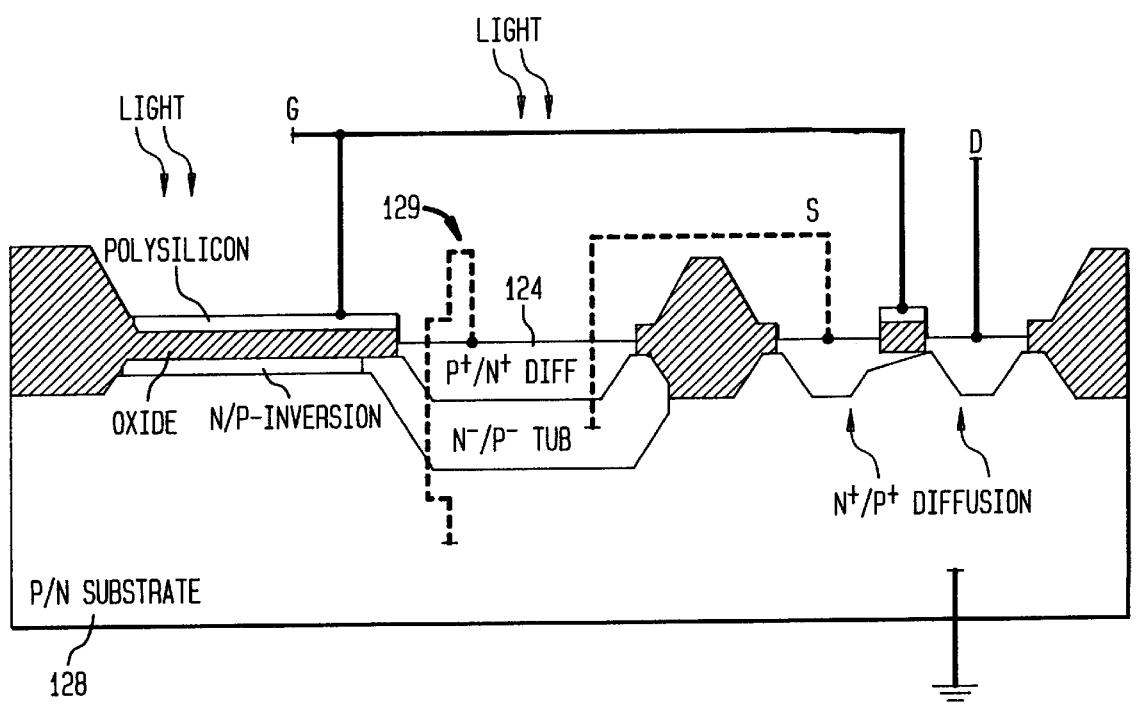

FIG. 12A shows a depiction of photofet 120A, according to another embodiment of the present invention. Photofet 120A is similar to photofet 110A of FIG. 11A, except that FIG. 12A shows cross-sectional views of both the photogate structure and one possible MOSFET structure. In this embodiment, the substrate side of the photogate and the body feature of the MOSFET are the same electrical region of the substrate, namely the semiconductor substrate bulk. Accordingly, the interconnection between the body terminal of the MOSFET and the substrate bulk is implicitly achieved.

As already discussed in connection with FIGS. 5A and 5B, the source-type diffused region 124 of the junction photo-diode gets connected to the semiconductor substrate bulk 128. This electrical connection, shown by dashed line 129 in FIG. 12A, may be accomplished using an integrated thin-film conductor, a vertical via hole in the tub-type region, or some other geometrical arrangement such as shown in FIGS. 14A and 14B.

Figure 12B:
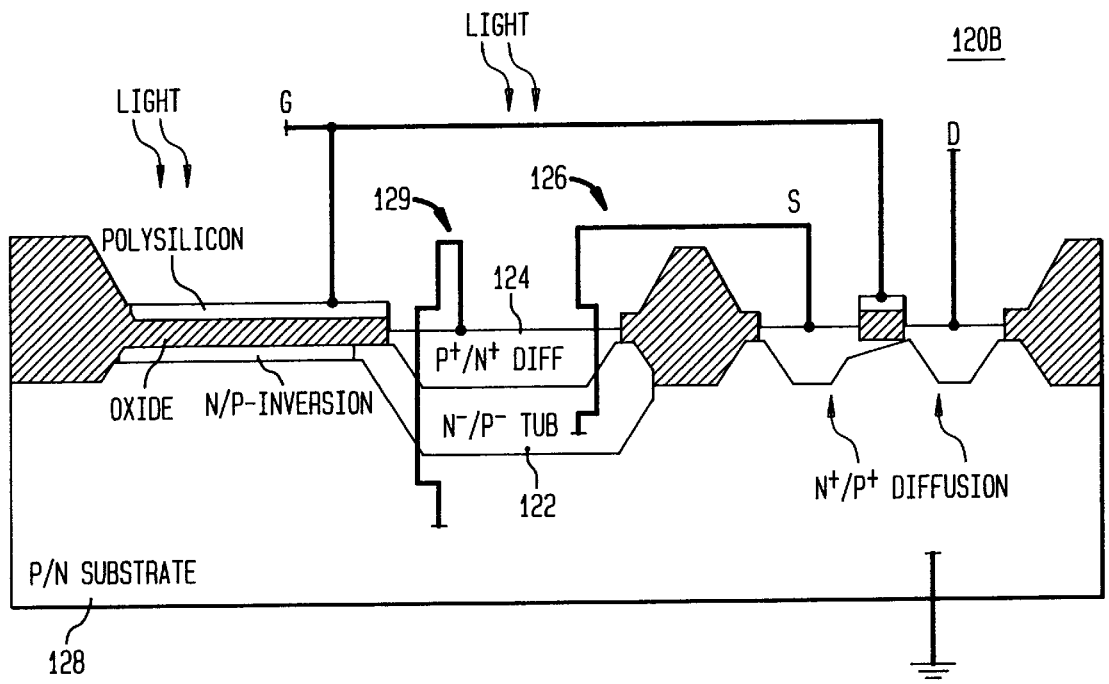

FIG. 12B shows a depiction of photofet 120B, according to another embodiment of the present invention. Photofet 120B is similar to photofet 120A of FIG. 12A, except that, in this embodiment, the interconnection 126 between the source terminal S of the MOSFET and the tub-type feature 122 of the junction photo-diode as well as the interconnection 129 between the source-type diffusion feature 124 and the semiconductor substrate bulk 128 are specifically disposed as integrated thin-film interconnections (depicted in FIG. 12B as solid lines).

Figure 13:
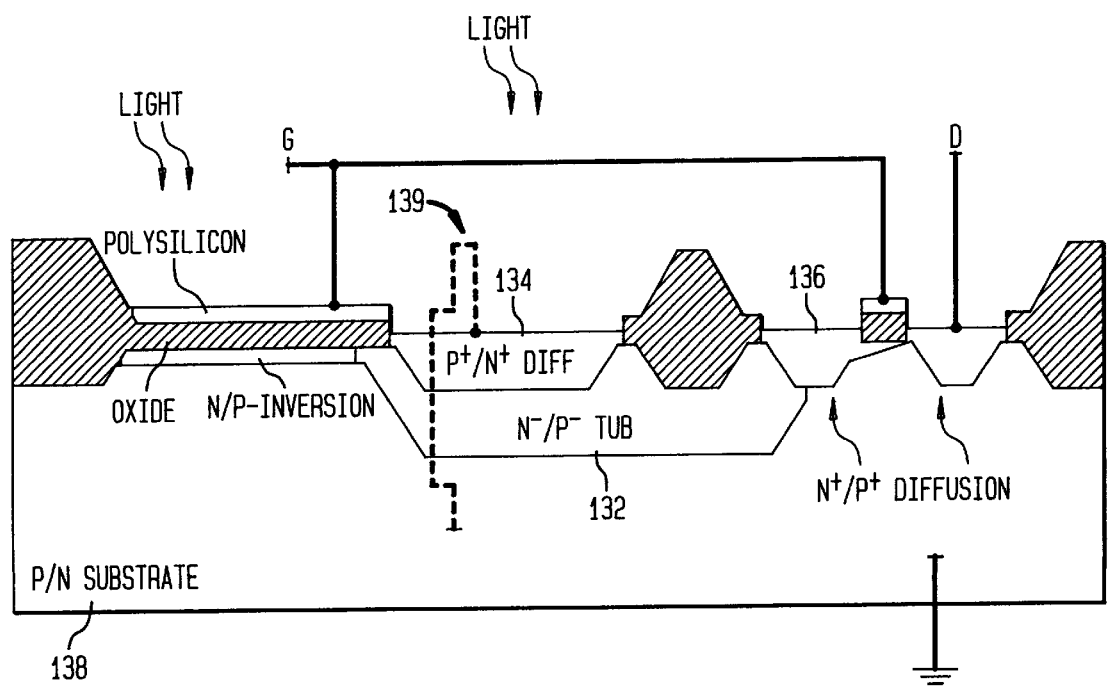

FIG. 13 shows a depiction of photofet 130, according to another embodiment of the present invention. Photofet 130 is similar to photofet 120A of FIG. 12A, except that, in this embodiment, at least a part of the source feature 136 of the MOSFET is contained in a portion of the tub-type feature 132 of the junction photo-diode not having a source-type feature, such that the source feature of the MOSFET and the tub-type feature of the junction photo-diode are one contiguous electrical region. The electrical connection, shown by dashed line 139 in FIG. 13, may be disposed as an integrated thin-film interconnection, a vertical via hole in the tub-type region, or some other geometrical arrangement that would make the diode feature 134 a physical and electrical region of the semiconductor substrate bulk 138 (such as shown in FIGS. 14A and 14B).

FIGS. 14A–B show depictions of photofets 140A and 140B, according to other embodiments of the present invention. Photofets 140A and 140B are similar to photofets 80A and 80B of FIGS. 8A and 8B, respectively, except that, in these embodiments, a CMOS tub-type feature 142 of the junction photo-diode underlies the source-type feature 144 of the junction photo-diode only partially, such that the source-type feature is electrically and physically a part of the semiconductor substrate bulk.

Figure 15:
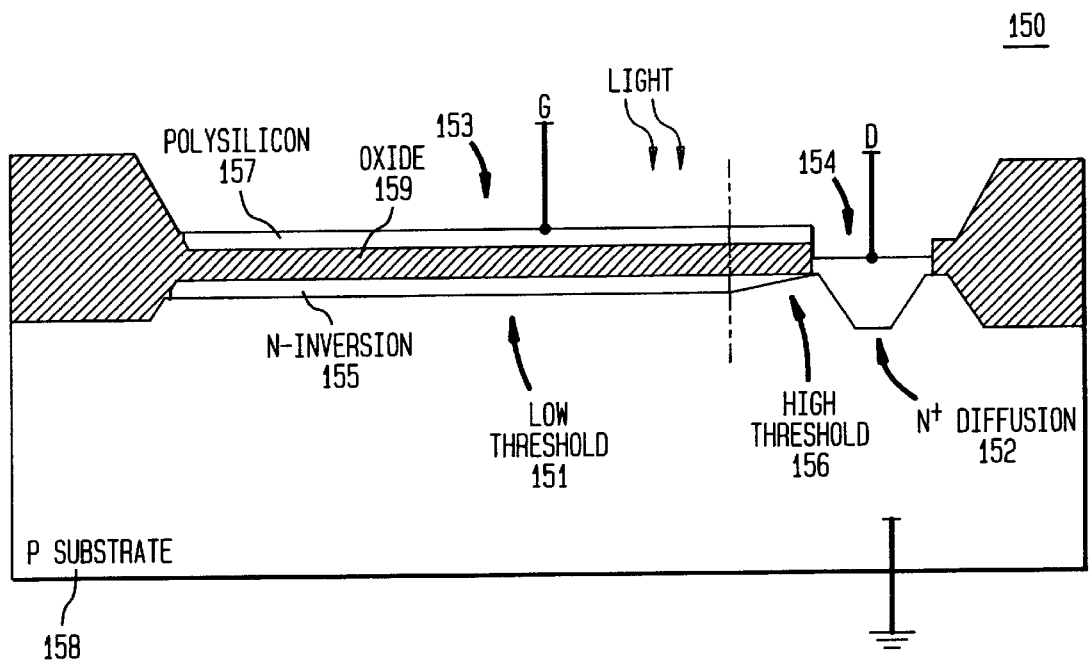

FIG. 15 shows a depiction of photofet 150, according to another embodiment of the present invention. Photofet 150 is a high output impedance, three-terminal, photosensing electrical device integrated on a semiconductor substrate 158. Photofet 150 has a body terminal, a gate terminal, and a drain terminal, the body terminal being an electrical contact to the semiconductor substrate bulk. Photofet 150 comprises an MOS capacitor sub-structure 153 disposed over a first region of semiconductor substrate 158 having two different (unequal) inversion thresholds, and a diode substructure 154 disposed over a second region of semiconductor substrate 158. Sub-region 156 of the first region of substrate 158 is disposed between the second region of substrate 158 and sub-region 151 of the first region of substrate 158, such that sub-region 151 abuts sub-region 156, but not the second region of substrate 158, containing the diffused diode substructure 154. The threshold voltage of sub-region 156 has a higher magnitude than the threshold voltage of sub-region 151. During operation, bias voltage VG, relative to the body, is applied to the photofet gate G such that the surface of sub-region 151 is inverted, and bias voltage VD, relative to the body, is applied to the photofet drain D such that junction diode 154 is reverse biased.

The space-charge regions that materialize in semiconductor sub-regions 151 and 156 form a contiguous space-charge region with the space-charge region of the junction diode. The photofet responds to light absorbed in this contiguous space-charge region, although, in a typical application, light is allowed to reach only the space-charge region materializing in the semiconductor substrate sub-region 151. In particular, light absorbed in any portion of the contiguous space-charge region causes a leakage (reverse) current to flow across the junction diode and through the external circuit that keeps the diode biased. The space-charge region materializing in substrate sub-region 156 (drift region), forms a potential barrier between the inversion layer materializing in sub-region 151 and the diffused side of the junction diode 154 making these two features electrically disjoined, such that the output impedance of the photofet depends only on the dimensions of the junction diode.

The two inversion threshold values for capacitor 153 may be equivalently defined during fabrication either by variously adjusting the dopant concentration of the surface of the semiconductor substrate, or by constructing the capacitor using either two different thicknesses or two different dielectric constants for the dielectric feature 159. In particular, the thickness and dielectric constants of the dielectric feature 159 can be composed by a superposition of several dielectric layers of similar or dissimilar dielectric materials.

The field plate 157 is a conducting thin-film layer, which is transparent to light. The combination of field-plate thin-film layer 157 and thin dielectric layer 159 are adequately transparent to a target portion of incident-light spectrum to allow light directed toward photofet 150 from the top (as shown in FIG. 15) to reach the substrate region 155 without suffering significant attenuation.

In general, the geometric features that render the junction diode sub-structure 154, the MOS capacitor sub-structure 153, and their topological adjacencies, may involve encircling features, both planar and three-dimensional, and also parallel arraying. For example, the MOS capacitor sub-structure may encircle the junction diode sub-structure, and vice versa.

Relative advantages of photofet 150 over photofet 140 are higher area efficiency, and (since photofet 150 comprises only one junction diode feature) less susceptibility to the type of point defects known to make photo-diodes leaky.

Figure 16A:
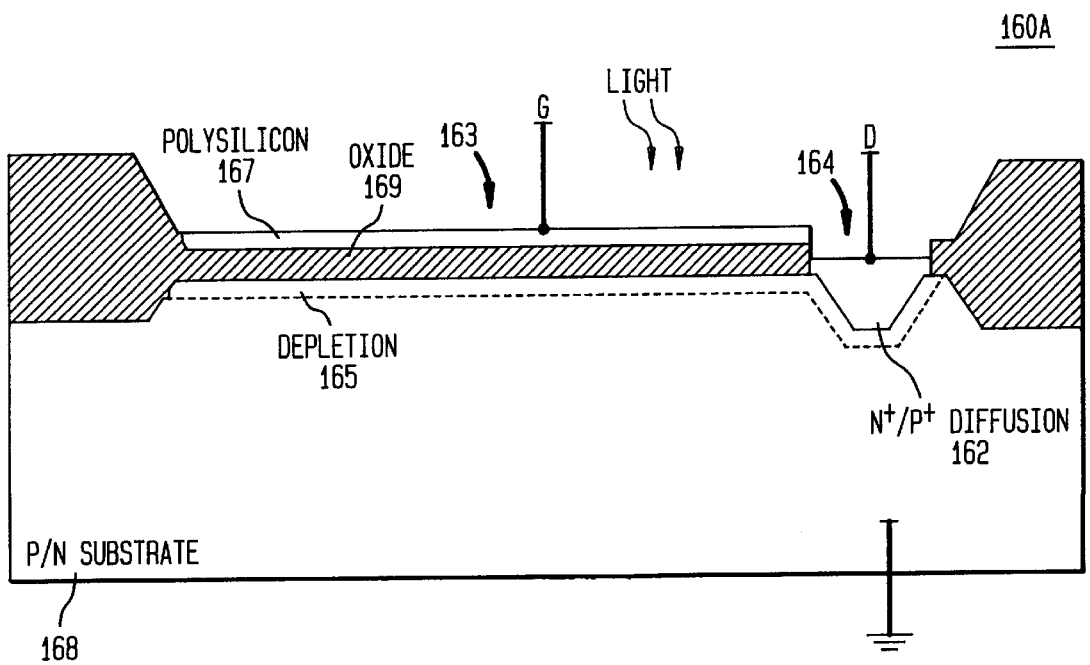

FIG. 16A shows a depiction of photofet 160A, according to another embodiment of the present invention. Photofet 160A is similar to photofet 150 of FIG. 15, except that, in this embodiment, the photofet is intended to operate with the semiconductor region 165 depleted in its entirety.

Figure 16B:
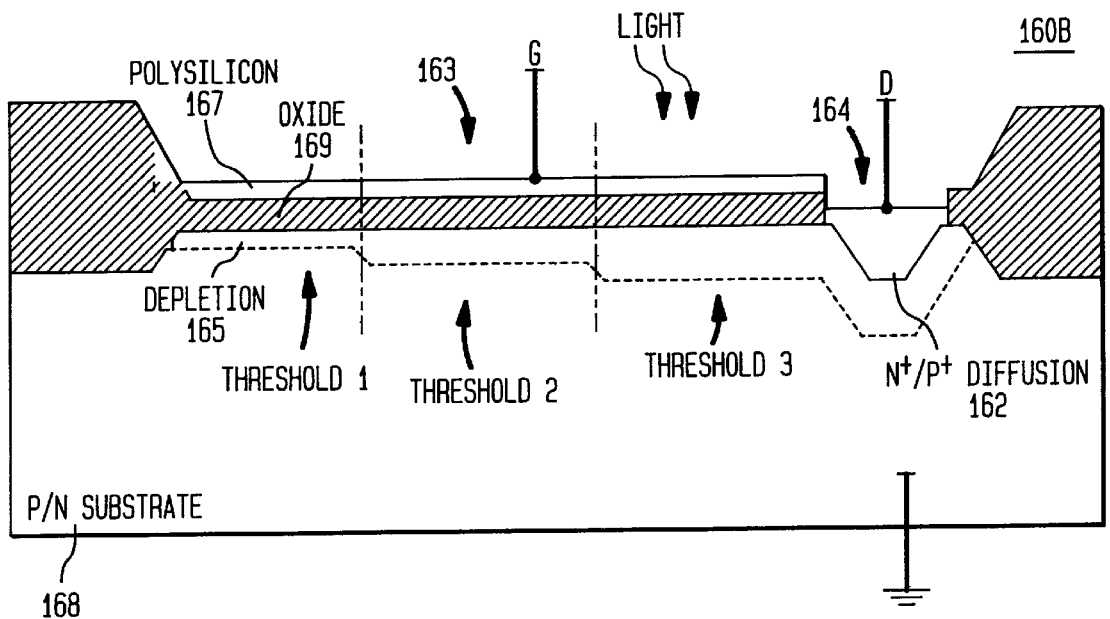

Accordingly, in one implementation shown in FIG. 16A, the MOS capacitor 163 has a single inversion threshold voltage. In another implementation, the threshold voltage of capacitor 163 varies across the width and possibly the length (length being a dimension in the direction normal to the plane of the cross-sections shown in FIGS. 16A and 16B), such that the lateral field in every point of this depleted region is either zero, or has a nonzero value and a direction promoting the drift of photo-carriers laterally, towards junction diode 164 for ultimate collection. In particular, FIG. 16B shows a cross-section of photofet 160B, being a photofet similar to photofet 160A of FIG. 16A, except that the inversion threshold of MOS capacitor 163 has three values disposed across its width, such that the threshold value is stepwise-increasing, laterally, as a function of increasing distance from the junction diode. The junction diode abuts only the region of the photo-capacitor with the lowest threshold value, so that its space-charge region adjoins the deepest potential well forming into the semiconductor side of MOS capacitor 163.

To operate photofets 160A and 160B bias voltage VD relative to the body is applied to the photofet drain such that junction diode 164 is reverse biased and bias voltage VG relative to the body is applied to the photofet gate such that the MOS capacitor is biased into depletion.

Photofets 160A and 160B have a relative advantage over photofet 150 in that they can further function as two-terminal, high-output-impedance electrical devices, when the terminals G and D of these photofets are connected together. In particular, the output impedance of photofets 160A and 160B, unlike the output impedance of photofet 150 remains high even after connecting the terminals G and D together, because the capacitance of a depleted MOS capacitor is much smaller than the capacitance of a structurally similar inverted MOS capacitor.

However, photofets 160A and 160B, also have a serious disadvantage relative to photofet 150, in that they generate much larger thermal leakage currents (dark response currents). This disadvantage is unavoidable since the thermal leakage current generated in a depleted MOS capacitor is much larger than the thermal leakage current generated in a structurally similar, but inverted MOS capacitor.

A relative advantage of photofet 160B over photofet 160A is that, in the latter, photo-carriers generated in the space-charge region under the dielectric feature 169 experience the force of a lateral electric field, which causes them to drift towards the junction-diode (164) side of the photofet.

In general, photofet 160A performs adequately, if the lateral dimensions of the MOS capacitor are small relative to the diffusion length of a photo-generated charge carrier. Photofet 160B is preferable to photofet 160A when the opposite is the case. In particular, a photo-generated concentration of charge carriers on its way toward collection will mostly recombine if it must travel for a long time, compared to the lifetime of the carriers. This is detrimental since the part of the concentration that recombines does not contribute to the response photocurrent. The time over which a photocarrier needs to diffuse is effectively decreased in photofet 160B by the action of the lateral electric field at each threshold discontinuity. This field causes the concentration to move toward collection faster by adding lateral drift forces.

A further advantage of photofet 160B over photofet 160A is that the sensitivity of the latter can be stepwise adjusted during operation by adjusting the bias voltage of the gate. Normally, the gate G is biased with voltage magnitude high enough to cause the entire region 165 of the substrate to deplete. However, by supplying lesser bias, it is possible to selectively (stepwise) deplete only a sub-region of the substrate region 165, such that only a fraction of the MOS capacitor area is photo-active.

This property is particularly useful in photo-integrator circuits for active imaging arrays. Photo-integrator circuits sweep the value of the voltage applied at the drain terminal of the photosensor. Thus, by connecting the gate G to the drain D of photofet 160B, and using it as a two-terminal sensor in a photo-integrator circuit for imaging arrays, it leads to imaging arrays having companding response characteristics. A companding response characteristic is a non-linear, saturating response characteristic, such that the output for given input level is a decreasing function of the input level. A companding characteristic is used to increase the dynamic range of an imager array, at the cost of lower gray-scale resolution at the high end of input level. Such arrays are useful in robotics applications, and may find wide use in guidance systems for automobiles. In such systems, the input scene may routinely contain highlight regions of far higher level than the main field. An imager with non-companding capabilities, for example, would saturate at the level of the headlights of the nearest oncoming vehicle in an automotive application, and could then miss other, possibly vital, information in the field. Under the same circumstances, a companding imager would handle the highlights, and could still have dynamic range left to adequately capture details at the non-highlight areas of the field.

In embodiments 160A and 160B, the MOS capacitor is always depleted during operation. If it were permitted to invert, the output impedance of the photofet would be a function of, and dominated by, the impedance of the MOS capacitor and therefore would be very low. The space-charge regions that materialize in the semi-conductor sub-region 165 form a contiguous space-charge region with the space-charge region of the junction diode 164. The photofet responds to light absorbed in this contiguous space-charge region, although in a typical application light is allowed to reach only the space-charge region materializing in the semiconductor substrate sub-region 165.

In particular, light absorbed in any portion of the contiguous space-charge region causes a leakage (reverse) current to flow across the junction diode and through the external circuit that keeps the diode biased. The plurality of threshold values required for the MOS capacitor 163 may be equivalently defined during fabrication either by variously adjusting the dopant concentration of the surface of the semiconductor substrate, or by constructing the capacitor using varying thicknesses or dielectric constants for the dielectric feature 169. In particular, the thickness and dielectric constants of the dielectric feature 169 can be composed by the superposition of several dielectric layers of similar or dissimilar dielectric materials.

The field plate 167 is a conducting thin-film layer, which is transparent to light. The combination of field-plate layer 167 and dielectric layer 169 are adequately transparent to a target portion of incident-light spectrum to allow light directed toward photofet 160A or 160B from the top (as shown in FIG. 16) to reach the substrate region 165 without suffering significant attenuation.

In general, the geometric features that render the junction diode sub-structure 164, the MOS capacitor sub-structure 163, and their topological adjacencies, may involve encircling features, both planar and three-dimensional, and also parallel arraying. For example, the MOS capacitor sub-structure may encircle the junction diode sub-structure, and vice versa.

Operation

When biased for operation, the photofets of the present invention operate as photosensors that convert incident light into an electrical current. In particular, light penetrating into the junction region between the substrate and the adjacent features of the photofet structure, when absorbed there, causes electron-hole pairs to be generated. These pairs are separated by the electric field of the junction and, where bias conditions permit it, cause a current (photoleakage) to flow across the junction and out to the external circuit through a load device. The current flowing through the load device is proportional to the light level absorbed in the substrate-junction region and constitutes a signal. Since the signal is proportional to light energy absorbed only within the confines of the depleted junction region, the signal is proportional to the incident light flux, and to both the lateral and vertical dimensions of the substrate junction. This makes the signal output dependent on the area of the device and on the depletion width of the junction, which may be varied by the applied bias voltage. The sensitivity of the device (defined as the ratio of signal output to incident light flux) is a function of the active area of the device (defined as the portion of substrate junction intercepting light flux) and the depletion width of the substrate junction of the active area of the device.

The photofets of FIGS. 1A through 16B may be operated in similar fashion. In particular, the photofet structures built on n-type substrates, operate exactly as their counterpart photofets built on p-type substrates, except that the polarity of all applied and generated voltages gets reversed. In order to simplify the present section, the scope of further discussion is limited to photofets built on p-type substrates, and all references to photofets are to be understood as references to photofets built on p-type substrates.

In operation, the body terminal of the photofet is typically connected to the reference node of the biasing circuit (i.e., the ground node). Gate terminal G and drain terminal D of the photofet are then biased relative to the body terminal. In all subsequent discussion, it is assumed that a photofet operates in such context.

Bias VG, applied at the terminal G of a photofet, must be (algebraically) greater than the threshold voltage of the MOSFET transistor of the photofet. (The term "algebraically" implies that the signs of the values are taken into account. Thus, a voltage with a value +2 is algebraically greater than a voltage with a value −3, even though the magnitude of the second voltage is greater than the magnitude of the first voltage.) If the MOSFET transistor of the photofet is depletion type, then VG can take a negative, a zero, or a positive value. However, in a typical application, the MOSFET is enhancement type, and the value of VG is then necessarily positive. In every case, bias VD, applied at the terminal D, must be (algebraically) high enough to keep the MOSFET transistor saturated at a given value of VG. Accordingly, VD must be (algebraically) greater than the difference (VD−Vth), where Vth is the (algebraic) value of the threshold voltage of the MOSFET transistor. The value of Vth is positive for an enhancement-type transistor, and negative for a depletion-type transistor. Generally, it is desirable to give VD a large positive value, since the value of VD determines the dynamic range of the photofet's output. It is further desirable to give VG a high positive value, since the width of the photo-active region of the device increases as the value of VG (algebraically) increases.

Figure 17:
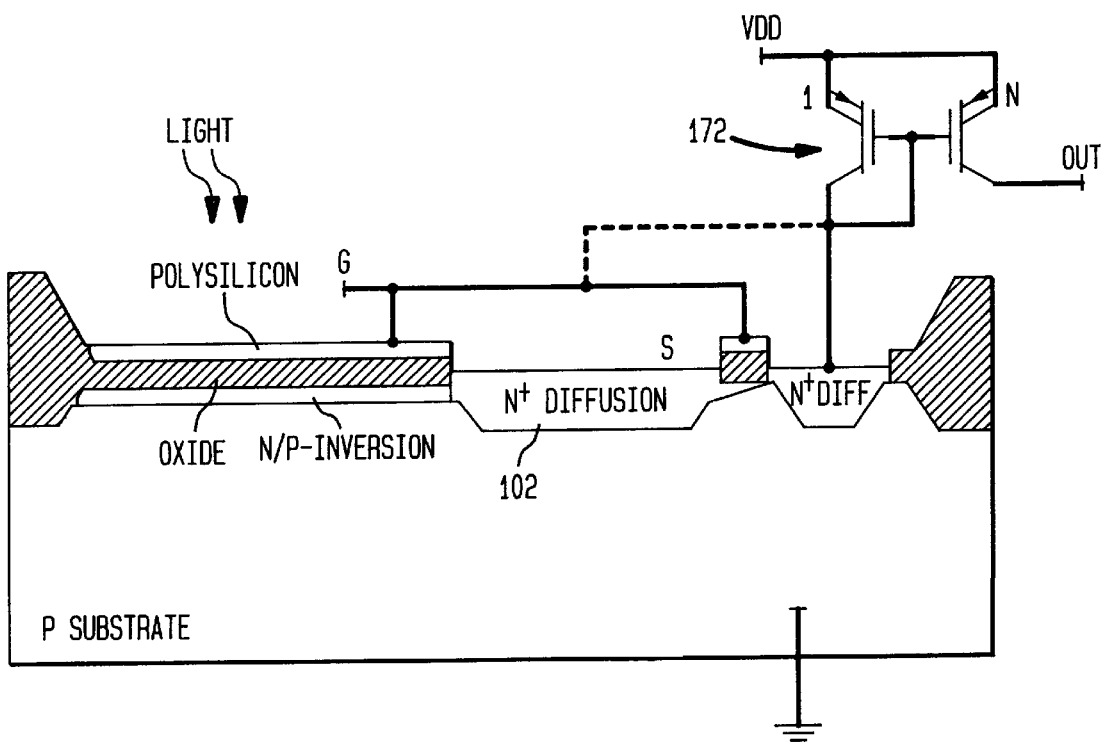
FIG. 17 shows a depiction of the photofet of FIG. 10A configured with a mirror load circuit.

A photofet device, like any photosensing electrical device that produces output in the form of a current signal, typically must be loaded with a passive or active load, which allows for the current signal to be converted into a voltage signal. A passive load can be an integrated resistor, or capacitor, through which the output current is forced to pass. An active load can be an integrated circuit such as the current mirror of FIG. 17, which can buffer and possibly amplify the output of the photosensor device.

A photosensor with high output impedance, such as a photofet, can be loaded effectively with a passive load. By contrast, a photosensor with low output impedance such as a photo-diode cannot be loaded effectively with a passive load, it must be loaded with an active load. Since active loads require several devices and interconnections to implement, they are potentially very costly, to the point of being entirely impractical to use as is the case in imaging applications, which routinely require imager arrays with several hundred thousand pixel sites. In particular, a photofet loaded passively with a capacitor makes a very cost effective photo-integrator circuit for a pixel site of an imager of the type known as an active pixel sensor (APS) imager.

In an example photo-integrator circuit, the load capacitor is connected between the drain terminal and the body terminal of the photofet. The operating cycle of the circuit comprises a reset part and an integrating part. During the reset part, the capacitor is pre-charged by temporarily applying a voltage VDD across it. This voltage initially, and the voltage across the capacitor subsequently, provides drain bias (VD) for the photofet. During the integrating part, the source of the VDD voltage is removed from the circuit and the capacitor is allowed to discharge through the leakage path provided by the photofet, the photofet's behavior being that of a light-controlled current source. At the end of the integrating part, the voltage across the capacitor is subtracted from the initial voltage VDD and the result is recorded as the photo-integrator's response.

In a digital application, this response, or possibly its complement with respect to VDD, is converted into a digital word, and it is passed on. For full motion video, the integration cycle is typically 1/30th to 1/60th of a second. Integration is used by imagers because it improves the signal-to-noise ratio produced.

In all applications (including photo-integrator applications), when the photofet is used as a three-terminal device, the bias voltage VG applied at the gate of the photofet is an operating parameter. It may be kept permanently fixed or be made adjustable by the application, in which case it may be made adjustable under the control of a servo mechanism responding to ambient conditions, such as illumination spectrum, or ambient light flux. The value of VG can also be used to adjust the dark current performance of the photofet.

Design

The dimensions of a photofet structure may be adjusted to meet specific application needs. The size of the drain diffusion of the MOS transistor defines the output capacitance of the device, and is preferably kept small. The photocurrent output of the device is proportional to the total device area that is allowed to photo-leak. For best low-frequency noise performance, all MOS gate areas are made large. Making the MOS transistor gate large and photo-leaky improves noise performance without area penalty. However, any trade-off of photogate device area for MOS transistor gate area increases dark current and makes the dark current sensitive to signal level. In photofet structures with both photo-capacitor and photo-diode features, photo-capacitor area can be traded off for photo-diode area freely, up to and including eliminating the photo-capacitor part of the photofet device completely. In photofet structures with both photo-capacitor and photo-diode features, photo-diode area can be traded off for photo-capacitor area freely, up to reducing the photo-diode to minimum size.

Those skilled in the art will appreciate that, unlike bipolar devices which cannot be easily isolated from adjacent ones when light is allowed to reach their common substrate, photofets are essentially self isolating and thus easy to use to form large integrated, one- or two-dimensional sensing arrays. Photofets are also easy to imbed in larger integrated circuits that further contain non-photosensing functions. In particular, it is possible to integrate, on a single semiconductor substrate, these sensors along with other circuitry to achieve an entire VLSI signal processing application such as a solid-state video camera.

The use of figure reference labels in the claims is intended to identify one or more possible embodiments of the claimed subject matter in order to facilitate the interpretation of the claims. Such labeling is not to be construed as necessarily limiting the scope of those claims to the embodiments shown in the corresponding figures.

It will be further understood that various changes in the details, materials, and arrangements of the parts which have been described and illustrated in order to explain the nature of this invention may be made by those skilled in the art without departing from the principle and scope of the invention as expressed in the following claims. For example, such changes include replacement of n-type features with p-type features, and vice versa, for the purpose of producing the complementary duals of the parts and structures that have been described and illustrated.

What is claimed is:

1. A high output impedance, three-terminal, photosensing electrical device (e.g., 10A, 10B) integrated on a semiconductor substrate, the photosensing electrical device having a body terminal, a gate terminal, and a drain terminal, the body terminal being an electrical contact to the semiconductor substrate bulk, and the photosensing electrical device comprising:

(a) a four-terminal MOSFET (Metal Oxide Semiconductor Field-Effect Transistor) having a body terminal, a source terminal, a gate terminal, and a drain terminal; and (b) a junction photo-diode having an anode side and a cathode side, wherein:

if the semiconductor substrate is p type, then the anode side is the semiconductor substrate bulk and the cathode side is an n-type feature diffused into the semiconductor substrate;

if the semiconductor substrate is n type, then the cathode side is the semiconductor substrate bulk and the anode side is a p-type feature diffused into the semiconductor substrate;

the source terminal of the MOSFET is electrically connected to the side of the photo-diode being a feature diffused into the semiconductor substrate;

if the semiconductor substrate is p type, then the MOSFET is n-channel type;

if the semiconductor substrate is n type, then the MOSFET is p-channel type;

the gate terminal of the MOSFET is the gate terminal of the photosensing electrical device;

the drain terminal of the MOSFET is the drain terminal of the photosensing electrical device; and the body of the MOSFET is electrically connected to the semiconductor substrate bulk.

2. The invention (e.g., 30) of claim 1, wherein the body of the MOSFET is the semiconductor substrate bulk and the source feature of the MOSFET and the diffused side of the photo-diode are merged into one physically and electrically contiguous region.

3. The invention (e.g., 40A, 40B) of claim 1, wherein the diffused side of the photo-diode is a deep, lightly doped, CMOS tub-type diffused feature, and further comprising a heavily doped, CMOS source-type feature diffused over the CMOS tub-type feature, wherein:

the source-type feature is defined by a dopant of opposite type from that defining the tub-type feature, such that two stacked photo-diode junctions are formed, one junction forming at the interface between the tub-type feature and the semiconductor substrate bulk and one junction forming at the interface between the source-type feature and the tub-type feature;

the two junctions are arranged such that light incident on the photosensing electrical device successively reaches and traverses first the junction between the source-type feature and the tub-type feature, and then residually the junction between the tub-type feature and the semiconductor substrate bulk; and the two junctions are arranged to be electrically connected in parallel.

4. The invention (e.g., 60) of claim 3, wherein the body of the MOSFET is the semiconductor substrate bulk and at least a part of the source feature of the MOSFET is contained in a portion of the tub-type feature of the photo-diode not having a source-type feature, such that the source feature of the MOSFET and the tub-type feature of the photo-diode are one contiguous electrical region.

5. The invention (e.g., 70A, 70B) of claim 3, wherein the CMOS tub-type feature of the photo-diode underlies the CMOS source-type feature of the photo-diode only partially, such that the CMOS source-type feature is electrically and physically a part of the semiconductor substrate bulk.

6. The invention of claims 1, further comprising:

(c) one or more thin-film photo-mask layers over one or more regions of the photosensing electrical device rendering such regions photo-inactive, while leaving other regions of the photosensing electrical device as photo-active;

(d) one or more thin-film color-filter layers over one or more of the photo-active regions of the photosensing electrical device restricting receptivity of the photosensing electrical device to light in a specific frequency band of the electromagnetic spectrum; and (e) thin-film overlay features for surface passivation or planarization that are non-masking over the photo-active regions of the photosensing electrical device.

7. The invention of claims 1, wherein the photosensing electrical device is part of a photo-detecting circuit that is part of an integrated imaging apparatus, comprising a one-dimensional or two-dimensional array of photo-detecting circuits integrated on a single substrate.

8. The invention of claim 1, wherein the photosensing electrical device is used in a photo-detecting circuit, wherein the photo-detecting circuit applies a bias voltage VG with respect to the body terminal of the photosensing electrical device at the gate terminal of the photosensing electrical device and a bias voltage VD with respect to the body terminal of the photosensing electrical device at the drain terminal of the photosensing electrical device, such that, under normal input illumination and output conditions, the bias voltages VG and VD force the MOSFET to operate in the saturation region of its characteristic.

9. The invention of claim 8, wherein the current flowing through the drain terminal of the photosensing electrical device passes through a two-terminal load device, and the response of the photo-detecting circuit to input illumination is a voltage drop across the two-terminal load device.

10. The invention of claim 9, wherein:

the two-terminal load device is a capacitor;

the photo-detecting circuit functions as a photo-integrator;

the operating cycle of the photo-detecting circuit comprises a reset phase and an integrating phase;

the output of the photo-detecting circuit is a sample of the voltage drop across the capacitor taken at a point in time during the integrating phase of the operating cycle;

the capacitor is connected across the drain and body terminals of the photosensing electrical device;

the voltage bias VD at the drain terminal of the photosensing electrical device is established by the instantaneous value of voltage across the capacitor;

the voltage across the capacitor is initialized during the reset phase of the operating cycle to a value VDD by temporarily connecting a voltage source of value VDD across the capacitor; and the response of the photo-detecting circuit is the difference between the value VDD and a sample of the voltage drop across the capacitor taken at a point in time during the integrating phase of the operating cycle.

11. The invention of claim 8, wherein the bias voltage VG is controlled by an intelligent servo mechanism and is adjusted during operation of the photo-detecting circuit for at least one of:

(a) adjusting sensitivity of the photo-detecting circuit;

(b) adjusting spectral response of the photo-detecting circuit;

(c) adjusting dark current output of the photo-detecting circuit; and (d) adjusting dynamic range of the photo-detecting circuit.

12. A high output impedance, three-terminal photosensing electrical device (e.g., 80A, 80B) integrated on a semiconductor substrate, the photosensing electrical device having a body terminal, a gate terminal, and a drain terminal, the body terminal being an electrical contact to the semiconductor substrate bulk, and the photosensing electrical device comprising:

(a) a four-terminal MOSFET having a body terminal, a source terminal, a gate terminal, and a drain terminal, wherein:

if the semiconductor substrate is p type, then the MOSFET is n-channel type; and if the semiconductor substrate is n type, then the MOSFET is p-channel type; and (b) an MOS photogate, comprising:

(1) an MOS photo-capacitor sub-structure having a substrate side and a field-plate side, wherein:

the dielectric medium is a thin (gate) dielectric layer;

the substrate side is the semiconductor substrate bulk;

the field plate side is a conducting thin-film layer; and the combination of thin dielectric layer and conducting thin-film layer are adequately transparent to a target portion of incident-light spectrum; and (2) a junction-diode sub-structure having an anode side and a cathode side, wherein:

if the semiconductor substrate is p type, then the anode side is the semiconductor substrate bulk and the cathode side is an n-type feature diffused into the semiconductor substrate;

if the semiconductor substrate is n type, then the cathode side is the semiconductor substrate bulk and the anode side is a p-type feature diffused into the semiconductor substrate, wherein:

the diffused side of the junction-diode sub-structure abuts the photo-capacitor sub-structure such that the space-charge region of the junction-diode sub-structure and the space-charge region, forming in the semiconductor substrate side of the photo-capacitor sub-structure when the photo-capacitor is biased into inversion or depletion, merge into one contiguous space-charge region;

the body of the MOSFET is electrically connected to the semiconductor substrate bulk;

the source terminal of the MOSFET is electrically connected to the diffused side of the junction diode sub-structure;

the gate terminal of the MOSFET is electrically connected to the field plate side the photo-capacitor sub-structure;

the drain terminal of the MOSFET is the drain terminal of the photosensing electrical device; and the gate terminal of the MOSFET is the gate terminal of the photosensing electrical device.

13. The invention (e.g., 100) of claim 12, wherein the body of the MOSFET is the semiconductor substrate bulk, and the source feature of the MOSFET and the diffused side of the photo-diode are merged into one physically and electrically contiguous region.

14. The invention (e.g., 110A, 110B) of claim 12, wherein the diffused side of the junction diode sub-structure is a deep, lightly doped, CMOS tub-type diffused feature, and further comprising a heavily doped, CMOS source-type feature diffused over the CMOS tub-type feature, wherein:

the source-type feature is defined by a dopant of opposite type from that defining the tub-type feature, such that two stacked photo-diode junctions are formed, one junction forming at the interface between the tub-type feature and the semiconductor substrate bulk and one junction forming at the interface between the source-type feature and the tub-type feature;

the two junctions are arranged such that light incident on the photosensing electrical device successively reaches and traverses first the junction between the source-type feature and the tub-type feature, and then residually the junction between the tub-type feature and the semiconductor substrate bulk; and the two junctions are arranged to be electrically connected in parallel.

15. The invention (e.g., 130) of claim 14, wherein the body of the MOSFET is the semiconductor substrate bulk and at least a part of the source feature of the MOSFET is contained in a portion of the tub-type feature of the junction diode sub-structure not having a source-type feature, such that the source feature of the MOSFET and the tub-type feature of the junction diode sub-structure are one contiguous electrical region.

16. The invention (e.g., 140A, 140B) of claim 14, wherein the CMOS tub-type feature of the junction diode sub-structure underlies the source-type feature of the junction diode sub-structure only partially, such that the source-type feature is electrically and physically a part of the semiconductor substrate bulk.

17. The invention of claims 12, further comprising:

(c) one or more thin-film photo-mask layers over one or more regions of the photosensing electrical device rendering such regions photo-inactive, while leaving other regions of the photosensing electrical device as photo-active;

(d) one or more thin-film color-filter layers over one or more of the photo-active regions of the photosensing electrical device restricting receptivity of the photosensing electrical device to light in a specific frequency band of the electromagnetic spectrum; and (e) thin-film overlay features for surface passivation or planarization that are non-masking over the photo-active regions of the photosensing electrical device.

18. The inventions of claims 12, wherein the photosensing electrical device is part of a photo-detecting circuit that is part of an integrated imaging apparatus, comprising a one-dimensional or two-dimensional array of photo-detecting circuits integrated on a single substrate.

19. The invention of claim 12, wherein the photosensing electrical device is used in a photo-detecting circuit, wherein the photo-detecting circuit applies a bias voltage VG with respect to the body terminal of the photosensing electrical device at the gate terminal of the photosensing electrical device and a bias voltage VD with respect to the body terminal of the photosensing electrical device at the drain terminal of the photosensing electrical device, such that, under normal input illumination and output conditions, the bias voltages VG and VD force the MOSFET to operate in the saturation region of its characteristic.

20. The invention of claim 19, wherein the current flowing through the drain terminal of the photosensing electrical device passes through a two-terminal load device, and the response of the photo-detecting circuit to input illumination is a voltage drop across the two-terminal load device.

21. The invention of claim 20, wherein:

the two-terminal load device is a capacitor;

the photo-detecting circuit functions as a photo-integrator;

the operating cycle of the photo-detecting circuit comprises a reset phase and an integrating phase;

the output of the photo-detecting circuit is a sample of the voltage drop across the capacitor taken at a point in time during the integrating phase of the operating cycle;

the capacitor is connected across the drain and body terminals of the photosensing electrical device;

the voltage bias VD at the drain terminal of the photosensing electrical device is established by the instantaneous value of voltage across the capacitor;

the voltage across the capacitor is initialized during the reset phase of the operating cycle to a value VDD by temporarily connecting a voltage source of value VDD across the capacitor; and the response of the photo-detecting circuit is the difference between the value VDD and a sample of the voltage drop across the capacitor taken at a point in time during the integrating phase of the operating cycle.

22. The invention of claim 19, wherein the bias voltage VG is controlled by an intelligent servo mechanism and is adjusted during operation of the photo-detecting circuit for at least one of:
  (a) adjusting sensitivity of the photo-detecting circuit;
  (b) adjusting spectral response of the photo-detecting circuit;
  (c) adjusting dark current output of the photo-detecting circuit; and
  (d) adjusting dynamic range of the photo-detecting circuit.

23. A high output impedance, three-terminal, photosensing electrical device (e.g., 150) integrated on a semiconductor substrate, the photosensing electrical device having a body terminal, a gate terminal, and a drain terminal, the body terminal being an electrical contact to the semiconductor substrate bulk, and the photosensing electrical device comprising:
  (a) an MOS photo-capacitor sub-structure having a semiconductor substrate side and a field-plate side, wherein:
    the dielectric medium is a thin (gate) dielectric layer;
    the substrate side is the semiconductor substrate bulk;
    the field plate side is a conducting thin-film layer; and
    the combination of thin dielectric layer and conducting thin-film layer are adequately transparent to a target portion of incident-light spectrum; and
  (b) a junction-diode sub-structure having an anode side and a cathode side, wherein:
    if the semiconductor substrate is p type, then the anode side is the semiconductor substrate bulk and the cathode side is an n-type feature diffused into the semiconductor substrate;
    if the semiconductor substrate is n type, then the cathode side is the semiconductor substrate bulk and the anode side is a p-type feature diffused into the semiconductor substrate;
    the gate terminal of the photosensing electrical device is an electrical contact to the field plate of the photo-capacitor sub-structure;
    the drain terminal of the photosensing electrical device is an electrical contact to the diffused side of the junction-diode sub-structure;
    the diffused side of the junction-diode sub-structure abuts the photo-capacitor sub-structure such that the space-charge region of the junction-diode sub-structure and the space-charge region, forming in the semiconductor substrate side of the photo-capacitor sub-structure when the photo-capacitor is biased into inversion or depletion, merge into one contiguous space-charge region;
    the photo-capacitor sub-structure is divided into two regions, each inverting at a different threshold voltage;
    if the semiconductor substrate is p-type, then the junction-diode sub-structure abuts only the region of the photo-capacitor sub-structure with the (algebraically) higher threshold voltage; and
    if the semiconductor substrate is n-type, then the junction-diode sub-structure abuts only the region of the photo-capacitor sub-structure with the (algebraically) lower threshold voltage.

24. The invention of claim 23, wherein the inversion thresholds of the photo-capacitor sub-structure are defined by the semiconductor doping concentration on the semiconductor substrate side of the photo-capacitor sub-structure.

25. The invention of claim 23, wherein the inversion thresholds of the photo-capacitor sub-structure are defined by the dielectric constant of the dielectric medium of the photo-capacitor sub-structure.

26. The invention of claim 23, wherein the inversion thresholds of the photo-capacitor sub-structure are defined by the thickness of the dielectric medium of the photo-capacitor sub-structure.

27. The invention of claim 23, further comprising:
  (c) one or more thin-film photo-mask layers over one or more regions of the photosensing electrical device rendering such regions photo-inactive, while leaving other regions of the photosensing electrical device as photo-active;
  (d) one or more thin-film color-filter layers over one or more of the photo-active regions of the photosensing electrical device restricting receptivity of the photosensing electrical device to light in a specific frequency band of the electromagnetic spectrum; and
  (e) thin-film overlay features for surface passivation or planarization that are non-masking over the photo-active regions of the photosensing electrical device.

28. The invention of claim 23, wherein the photosensing electrical device is part of a photo-detecting circuit that is part of an integrated imaging apparatus, comprising a one-dimensional or two-dimensional array of photo-detecting circuits integrated on a single substrate.

29. The invention of claim 23, wherein the photosensing electrical device is used in a photo-detecting circuit, wherein the photo-detecting circuit applies a bias voltage VG with respect to the body terminal of the photosensing electrical device at the gate terminal of the photosensing electrical device and a bias voltage VD with respect to the body terminal of the photosensing electrical device at the drain terminal of the photosensing electrical device, such that, under normal input illumination and output conditions, the bias voltage VD reverse biases the junction-diode sub-structure, and the bias voltage VG inverts the semiconductor substrate side of the photo-capacitor sub-structure.

30. The invention of claim 29, wherein the current flowing through the drain terminal of the photosensing electrical device passes through a two-terminal load device, and the response of the photo-detecting circuit to input illumination is a voltage drop across the two-terminal load device.

31. The invention of claim 30, wherein:
  the two-terminal load device is a capacitor;
  the photo-detecting circuit functions as a photo-integrator;
  the operating cycle of the photo-detecting circuit comprises a reset phase and an integrating phase;
  the output of the photo-detecting circuit is a sample of the voltage drop across the capacitor taken at a point in time during the integrating phase of the operating cycle;
  the capacitor is connected across the drain and body terminals of the photosensing electrical device;
  the voltage bias VD at the drain terminal of the photosensing electrical device is established by the instantaneous value of voltage across the capacitor;
  the voltage across the capacitor is initialized during the reset phase of the operating cycle to a value VDD by temporarily connecting a voltage source of value VDD across the capacitor; and
  the response of the photo-detecting circuit is the difference between the value VDD and a sample of the voltage drop across the capacitor taken at a point in time during the integrating phase of the operating cycle.

32. The invention of claim 29, wherein the bias voltage VG is controlled by an intelligent servo mechanism and is adjusted during operation of the photo-detecting circuit for at least one of:

(a) adjusting sensitivity of the photo-detecting circuit;

(b) adjusting spectral response of the photo-detecting circuit;

(c) adjusting dark current output of the photo-detecting circuit; and (d) adjusting dynamic range of the photo-detecting circuit.

33. A high output impedance, three-terminal, photosensing electrical device (e.g., 160A, 160B) integrated on a semiconductor substrate, the photosensing electrical device having a body terminal, a gate terminal, and a drain terminal, the body terminal being an electrical contact to the semiconductor substrate bulk, and the photosensing electrical device comprising:

(a) an MOS photo-capacitor sub-structure having a semiconductor substrate side and a field-plate side, wherein:
the dielectric medium is a thin (gate) dielectric layer;
the substrate side is the semiconductor substrate bulk;
the field-plate side is a conducting thin-film layer; and
the combination of thin dielectric layer and conducting thin-film layer are adequately transparent to a target portion of incident-light spectrum; and (b) a junction-diode sub-structure having an anode side and a cathode side, wherein:
if the semiconductor substrate is p type, then the anode side is the semiconductor substrate bulk and the cathode side is an n-type feature diffused into the semiconductor substrate;
if the semiconductor substrate is n type, then the cathode side is the semiconductor substrate bulk and the anode side is a p-type feature diffused into the semiconductor substrate;
the gate terminal of the photosensing electrical device is an electrical contact to the field plate of the photo-capacitor sub-structure;
the drain terminal of the photosensing electrical device is an electrical contact to the diffused side of the junction-diode sub-structure;
the diffused side of the junction-diode sub-structure abuts the photo-capacitor sub-structure such that the space-charge region of the junction-diode sub-structure and the space-charge region, forming in the semiconductor substrate side of the photo-capacitor sub-structure when the photo-capacitor is biased into inversion or depletion, merge into one contiguous space-charge region;
the photo-capacitor sub-structure is divided into one or more regions, each inverting at a different threshold voltage;
if the semiconductor substrate is p-type, then the junction-diode sub-structure abuts only the region of the photo-capacitor sub-structure with the (algebraically) highest threshold voltage; and
if the semiconductor substrate is n-type, then the junction-diode sub-structure abuts only the region of the photo-capacitor sub-structure with the (algebraically) lowest threshold voltage.

34. The invention (e.g., 160B) of claim 33, wherein:
the photo-capacitor sub-structure is divided into two or more regions, each inverting at a different threshold voltage;
each region abuts one or two other regions;
each region that abuts two other regions, abuts one region with (algebraically) higher threshold voltage and one region with (algebraically) lower threshold voltage than its own;
each region that abuts only one other region:
abuts a region with (algebraically) lower threshold voltage than its own, if the semiconductor substrate is p type; and
abuts a region with (algebraically) higher threshold voltage than its own, if the semiconductor substrate is n type;
the diffused side of the junction-diode sub-structure abuts only one region of the photo-capacitor sub-structure;
if the semiconductor substrate is p-type, the diffused side of the junction-diode sub-structure abuts the region of the photo-capacitor with the (algebraically) lowest threshold voltage; and
if the semiconductor substrate is n-type, the diffused side of the junction-diode sub-structure abuts the region of the photo-capacitor with the (algebraically) highest threshold voltage.

35. The invention of claim 34, wherein the inversion thresholds of the photo-capacitor sub-structure are defined by the semiconductor doping concentration on the semiconductor substrate side of the photo-capacitor sub-structure.

36. The invention of claim 34, wherein the inversion thresholds of the photo-capacitor sub-structure are defined by the dielectric constant of the dielectric medium of the photo-capacitor sub-structure.

37. The invention of claim 34, wherein the inversion thresholds of the photo-capacitor sub-structure are defined by the thickness of the dielectric medium of the photo-capacitor sub-structure.

38. The invention of claims 33, further comprising:

(c) one or more thin-film photo-mask layers over one or more regions of the photosensing electrical device rendering such regions photo-inactive, while leaving other regions of the photosensing electrical device as photo-active;

(d) one or more thin-film color-filter layers over one or more of the photo-active regions of the photosensing electrical device restricting receptivity of the photosensing electrical device to light in a specific frequency band of the electromagnetic spectrum; and (e) thin-film overlay features for surface passivation or planarization that are non-masking over the photo-active regions of the photosensing electrical device.

39. The invention of claim 33, wherein the photosensing electrical device is part of a photo-detecting circuit that is part of an integrated imaging apparatus, comprising a one-dimensional or two-dimensional array of photo-detecting circuits integrated on a single substrate.

40. The invention of claim 33, wherein the photosensing electrical device is used in a photo-detecting circuit, wherein the photo-detecting circuit applies a bias voltage VG with respect to the body terminal of the photosensing electrical device at the gate terminal of the photosensing electrical device and a bias voltage VD with respect to the body terminal of the photosensing electrical device at the drain terminal of the photosensing electrical device, such that, under normal input illumination and output conditions, the bias voltage VD reverse biases the junction-diode sub-structure, and the bias voltage VG depletes the semiconductor substrate side of the photo-capacitor sub-structure.

41. The invention of claim 40, wherein the current flowing through the drain terminal of the photosensing electrical device passes through a two-terminal load device, and the response of the photo-detecting circuit to input illumination is a voltage drop across the two-terminal load device.

42. The invention of claim 41, wherein:

the two-terminal load device is a capacitor;

the photo-detecting circuit functions as a photo-integrator;

the operating cycle of the photo-detecting circuit comprises a reset phase and an integrating phase;

the output of the photo-detecting circuit is a sample of the voltage drop across the capacitor taken at a point in time during the integrating phase of the operating cycle;

the capacitor is connected across the drain and body terminals of the photosensing electrical device;

the voltage bias VD at the drain terminal of the photosensing electrical device is established by the instantaneous value of voltage across the capacitor;

the voltage across the capacitor is initialized during the reset phase of the operating cycle to a value VDD by temporarily connecting a voltage source of value VDD across the capacitor; and the response of the photo-detecting circuit is the difference between the value VDD and a sample of the voltage drop across the capacitor taken at a point in time during the integrating phase of the operating cycle.

43. The invention of claim 42, wherein the photo-capacitor is an enhancement type device and the bias voltage VG is made equal to the bias voltage VD by electrically connecting the gate and drain terminals.

44. The invention of claim 40, wherein the bias voltage VG is controlled by an intelligent servo mechanism and is adjusted during operation of the photo-detecting circuit for at least one of:

(a) adjusting sensitivity of the photo-detecting circuit;

(b) adjusting spectral response of the photo-detecting circuit;

(c) adjusting dark current output of the photo-detecting circuit; and (d) adjusting dynamic range of the photo-detecting circuit.

* * * * *